United States Patent [19]

Ooishi

[11] Patent Number: 5,691,954
[45] Date of Patent: Nov. 25, 1997

[54] SEMICONDUCTOR MEMORY DEVICE IN WHICH DATA ARE READ AND WRITTEN ASYNCHRONOUSLY WITH APPLICATION OF ADDRESS SIGNAL

[75] Inventor: Tsukasa Ooishi, Hyogo, Japan

[73] Assignee: Mitsubishi Denki Kabushiki Kaisha, Tokyo, Japan

[21] Appl. No.: 768,077

[22] Filed: Dec. 16, 1996

Related U.S. Application Data

[60] Continuation of Ser. No. 589,223, Jan. 22, 1996, abandoned, which is a division of Ser. No. 329,912, Oct. 26, 1994, Pat. No. 5,517,459.

[30] Foreign Application Priority Data

Nov. 16, 1993 [JP] Japan .................................. 5-286882

[51] Int. Cl.$^6$ ........................................................ G11C 8/00
[52] U.S. Cl. ........................... 365/230.08; 365/230.06; 365/233; 365/239; 365/240
[58] Field of Search .......................... 365/230.08, 230.06, 365/233, 239, 240

[56] References Cited

U.S. PATENT DOCUMENTS 4,903,242  2/1990  Hamaguchi et al. .
5,068,848  11/1991  Rabaey et al. .
5,077,693  12/1991  Hardee et al. .
5,126,975  6/1992  Handy et al. .
5,243,560  9/1993  Amishiro et al. .
5,526,316  6/1996  Lin .................................. 365/230.08

OTHER PUBLICATIONS

"A 2-NS Cycle, 3.8-NS Access 512-KB CMOS ECL SRAM with a Fully Pipelined Architecture", Chappell et al., IEEE vol. 26, No. 11, Nov. 1991 pp. 1577-1584.

Primary Examiner—David C. Nelms
Assistant Examiner—Huan Hoang
Attorney, Agent, or Firm—Lowe, Price, LeBlanc & Becker

[57] ABSTRACT

A semiconductor memory device includes an address register circuit for storing a plurality of address signals when an address latch enable signal is active in synchronization with a basic timing signal. When an internal operation start instructing signal is activated, a selected address signal from the address register circuit is supplied to a row decoder and a column decoder for memory cell selection. While an internal memory selection operation is performed, an address signal is stored in the address register circuit. Application of an address signal and a memory accessing is carried out asynchronously.

27 Claims, 21 Drawing Sheets

SEMICONDUCTOR MEMORY DEVICE IN WHICH DATA ARE READ AND WRITTEN ASYNCHRONOUSLY WITH APPLICATION OF ADDRESS SIGNAL

This application is a continuation of application Ser. No. 08/589,223 filed Jan. 22, 1996, now abandoned, which is also a divisional of application Ser. No. 08/329,912 filed Oct. 26, 1994, now U.S. Pat. No. 5,517,459.

BACKGROUND OF THE INVENTION

1. Field of the Invention

The present invention is related to a semiconductor memory device, and particularly to circuitry for processing an input signal such as an address signal.

2. Description of the Related Art

FIG. 1 shows a schematic overall arrangement of a conventional semiconductor memory device. The shown memory device is a dynamic type semiconductor memory device to which row address signals and column address signals are time-division multiplexedly applied.

Referring to FIG. 1, the memory device includes a memory cell array MA having a plurality of memory cells arranged in rows and columns, an address buffer circuit AB receiving externally applied address signal bits Add0–Addm to generate internal address signals Ar and Ac, a row decoder RD receiving and decoding an internal row address signal Ar to generate a row selection signal designating a row in memory array MA, a column decoder CD receiving and decoding an internal column address signal Ac to generate a column selection signal designating a column in memory array MA, and a sense /IO gate block SG including sense amplifiers and IO gates.

Sense amplifiers are provided on the respective columns of memory array MA, and sense and amplify data of memory cells on a selected row. IO gates are provided for the respective columns and connecting to an internal data bus a selected column in response to the column selection signal from column decoder CD. Row decoder RD may include word drivers provided for the rows of memory array MA and for driving a selected row to a selected state according to the row selection signal.

The memory device further includes a data write circuit WB receiving an external write data DI and generating an internal write data to write the internal write data to a selected memory cell on a selected row and a selected column, and a data read circuit RB receiving an internal read data from a selected memory cell to generate an external read data DQ.

timing control signal generator TG receives a row address strobe signal /RAS providing a timing at which row address signals are latched, a column address strobe signal /CAS providing a timing at which column address signals are latched, and a write enable signal /WE designating data read/write mode of operation, to generate various internal control signals. Now, operations of the memory device of FIG. 1 will be described with reference to a timing chart of FIG. 2.

In FIG. 2, a signal RAS is an internal basic signal to define a memory access cycle and is generated in response to the row address strobe signal /RAS, from the generator TG.

When the signal /RAS goes low at time T21, a memory cycle starts. Address buffer circuit AB incorporates applied address signal bits Add0–Addm as a row address signal to generate an internal row address signal X1 in response to the rising of the signal RAS generated in synchronization with the row address strobe signal /RAS. Row decoder RD is activated in response to the signal RAS to decode the row address signal X1 to select a row of memory cells in the memory cell array MA. Then, sense amplifiers in the block SG is activated to amplify and latch data of the memory cells on the selected row.

At time T22, the signal /CAS goes low, and responsively the address buffer circuit AB incorporates applied address signal bits Add0–Addm as a column address signal Y1 to generate an internal column address signal. Column decoder CD is activated according to the falling of the signal /CAS and decodes the internal column address signal to generate a column selection signal. In the block SG, IO gate provided for a column designated by the column selection signal is rendered conductive. Writing or reading of data to a selected memory cell is effected by data write circuit WB or data read circuit RB. When the signal /WE is at a low level, writing of data is effected. When the signal /WE is at a high level, reading of data is effected.

The signals /RAS and RAS determine the activation timings of circuits related to a row selection operation, and the signal /CAS determines the activation timings of the circuits related to a column selection operation.

Data read timing is determined by the signal /CAS, and data write timing is determined by the signals /CAS and /WE.

In general, an access time TRAS required for the external output of a valid data from the falling of the signal /RAS is determined in the specification. Similarly, an access time TCAS is also determined for the signal /CAS in the specification.

If data of a memory cell on a different row and a different column is required, the signal /RAS is once deactivated at time T23 and the memory device is initialized. At time T24, the signal /RAS goes low, or is activated, and another memory cycle starts. A row address signal X2 and a column address signal Y2 are incorporated sequentially, and a memory cell is selected, and data DQ of the selected memory cell is outputted. When the memory cell data is read out, the signal /RAS goes high, or is deactivated at time T25.

As described above, a memory cycle is determined by the signal /RAS. Address signals are incorporated and then memory cell data is read out. In other words, incorporation of an address signal and reading of data of a corresponding memory cell cannot be performed asynchronously. Such asynchronisity also holds for data writing operation. One memory cycle includes an address incorporation time period and memory access operation period and thus a memory cycle period cannot be reduced.

SUMMARY OF THE INVENTION

The object of the present invention is to provide a semiconductor memory device in which incorporation of an address signal and accessing to a corresponding memory cell are performed asynchronously with each other.

A semiconductor memory device according to the present invention includes a memory cell array having a plurality of memory cells arranged in rows and columns, a decoder for selecting a memory cell in the memory cell array in accordance with a received address signal, an address storage for storing a plurality of address signals, and a controller for causing the address storage to store address signals and supplying an address signal from the address storage to the decoder in response to a control signal instructing a start of an internal operation.

While an internal operation is performed, an address signal is incorporated and stored in the address storage. An address signal stored in the address storage is supplied to the decoder in each starting of internal operation. An address incorporation time period is hidden in the internal operation period, and a memory cycle time can be reduced.

The foregoing and other objects, features, aspects and advantages of the present invention will become more apparent from the following detailed description of the present invention when taken in conjunction with the accompanying drawings.

DETAILED DESCRIPTION OF THE PREFERRED EMBODIMENTS

Figure 1:
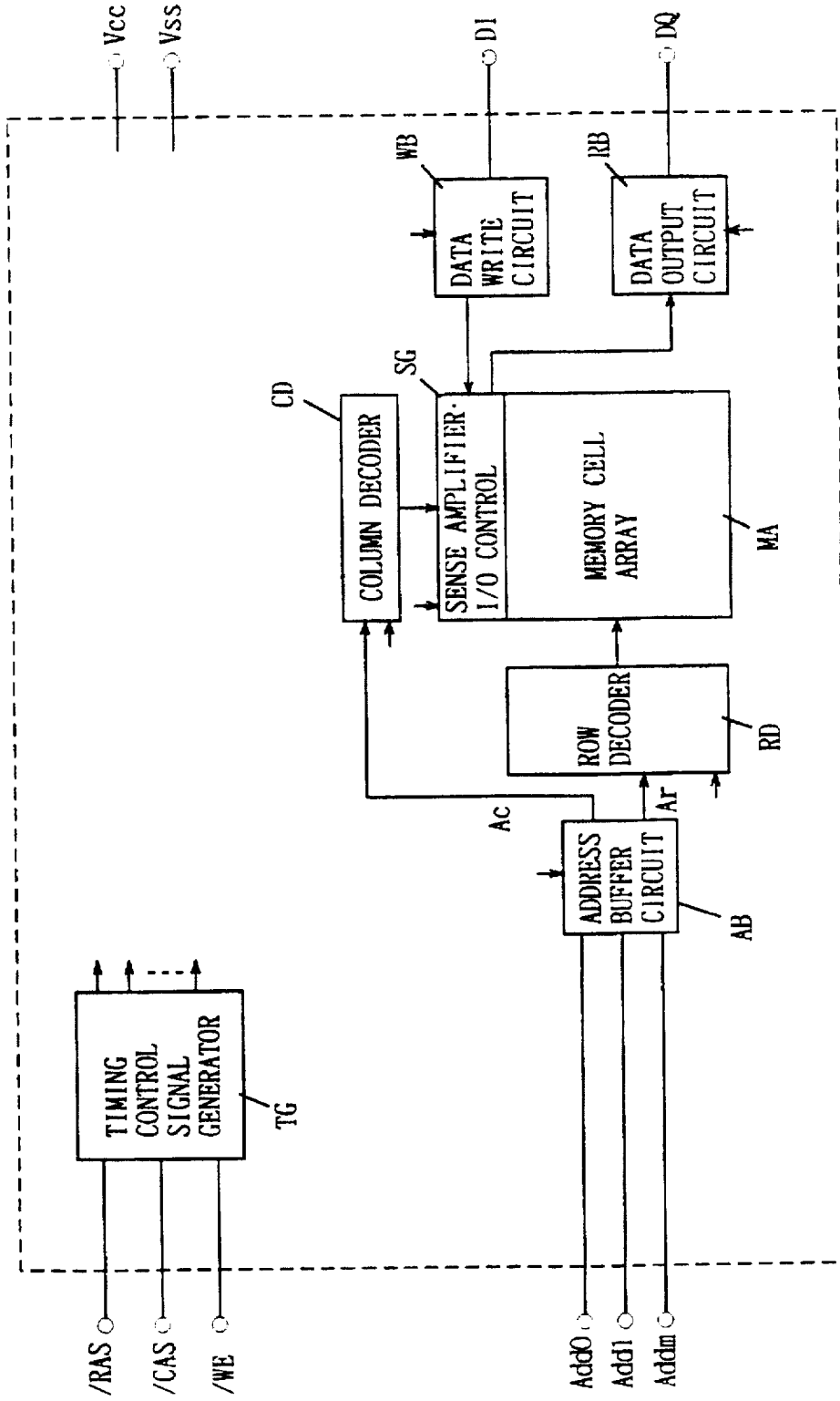
FIG. 1 shows a schematic overall arrangement of a conventional semiconductor memory device.
Figure 2:
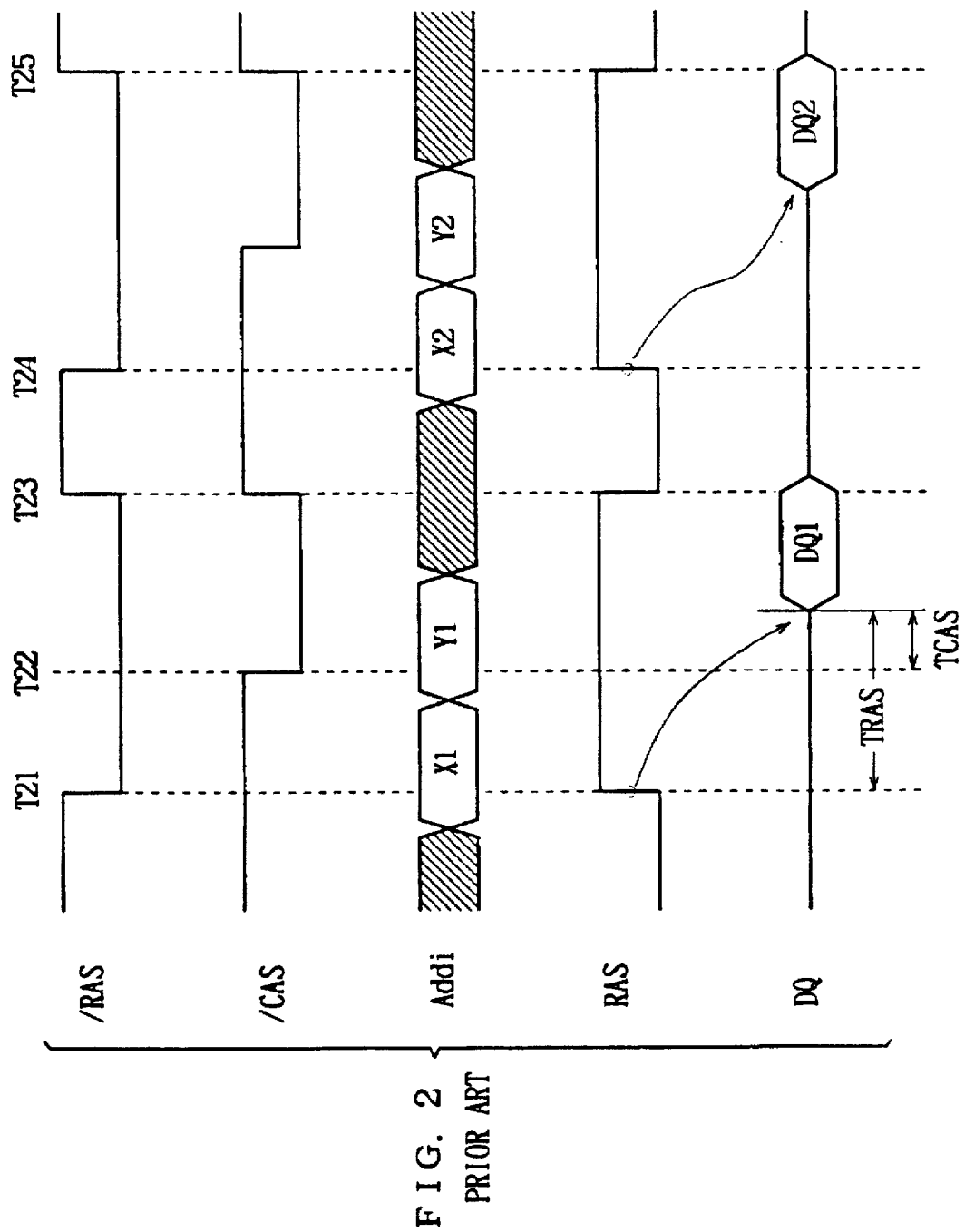
FIG. 2 is an operating waveform diagram showing an operation of the device of FIG. 1.
Figure 3:
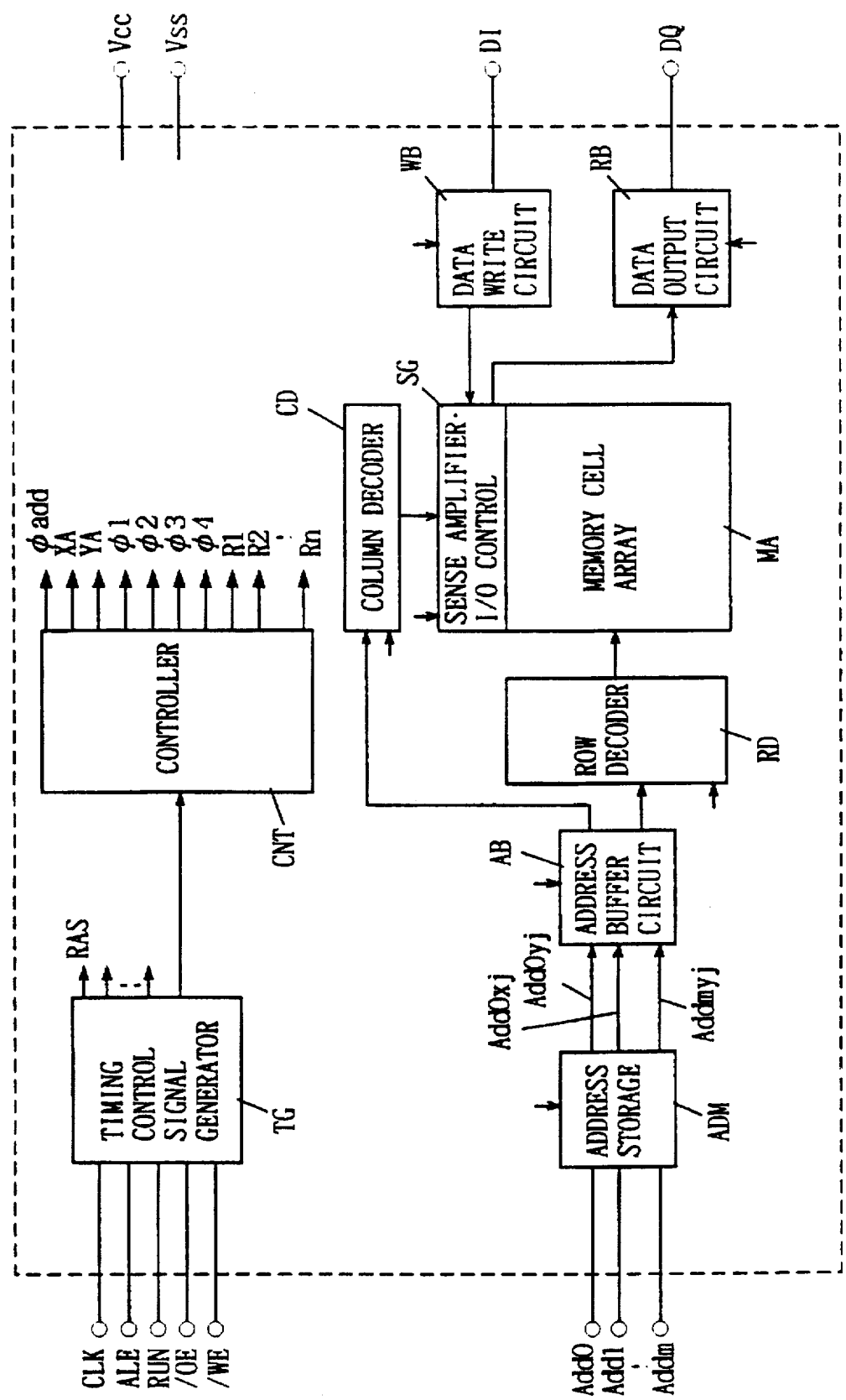
FIG. 3 shows a schematic overall arrangement of a semiconductor memory device according to an embodiment of the present invention.

FIG. 3 shows a schematic overall arrangement of a semiconductor memory device according to an embodiment of the present invention. Referring to FIG. 3, the memory device includes a memory cell array MA, a row decoder RD, a column decoder CD, a sense /IO gate block SG, a data write circuit WB and a data read circuit RB as in the conventional memory device.

The memory device includes a timing control signal generator TG receiving external control signals CLK, ALE, RUN, /OE, and /WE and generating various internal control signals, a controller CNT responsive to internal control signals from the generator TG for generating address read/write control signals which will be described later, and an address storage unit ADM responsive to the address read/write control signals from the controller CNT for storing externally applied address signal bits Add0–Addm in parallel and supplying a row address signal and a column address signal in parallel to the address buffer circuit AB.

The signal CLK is a basic signal, and other external control signals' states are determined at an edge of the signal CLK. The signal ALE is an address latch enable signal and indicates that the memory device is requested of accessing. Address signals are incorporated at edges of the signal CLK when the signal ALE is active (at H level, for example).

Figure 4:
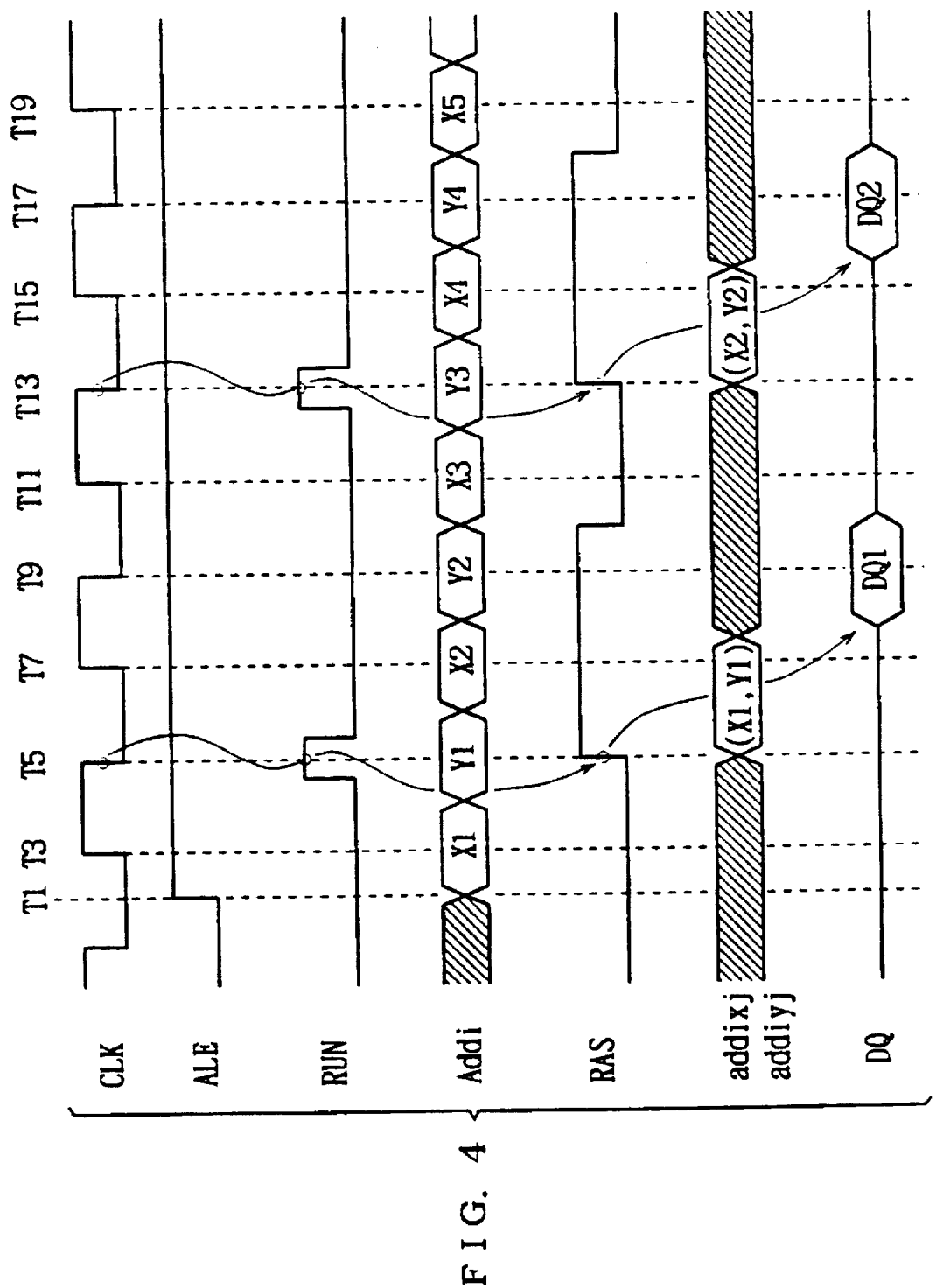
FIG. 4 is an operating waveform diagram showing an operation of the memory device of FIG. 3.

The signal RUN is an internal operation start instructing signal, and an internal basic signal RAS is generated, or activated for a predetermined time period in response to the signal RUN. The signal /OE is an output enable signal and activates the data output circuit RB. The signal /WE is a write enable signal, and activates the data write circuit WB. The signals generated from the controller will be described later. Now, the operation of the memory device of FIG. 3 will be described with reference to a timing chart of FIG. 4.

The basic signal CLK has a predetermined width and a predetermined period and is applied repeatedly to the memory device irrespective of whether the memory device is requested of accessing.

While the signal ALE is at a low level, no address signal is incorporated. When the address latch enable signal ALE goes high at time T1, address incorporation operation is enabled. At the rising edge of the basic signal CLK at time T3, address signal bits Add0–Addm are latched into the address storage unit ADM as a row address signal X1 under the control of the controller CNT. The signal RUN is inactive at a low level, and no internal operation such as row selection operation is performed.

At the falling edge of the basic signal CLK at T5, address signal bits Add0–Addm are latched into the address storage unit ADM as a column address signal Y1. At this time,. the signal RUN goes high for a predetermined time duration, and responsively the signal RAS from the generator TG goes high for a predetermined period. Internal operation is enabled, and the address signals X1 and Y1 are supplied from the address storage unit ADM to row decoder RD and column decoder CD and a memory selection operation is effected. Data DQ1 of a memory cell addressed by the address signals X1 and Y1 is read out.

In order to designate the data read mode of operation or the data write mode of operation, the signal /OE or the signal /WE may be activated (at L level) at the falling edge of the basic CLK. Alternatively, the signal /OE may be activated asynchronously with the basic signal CLK. Further, the signals /OE and /WE may be activated at the first rising edge of the basic clock following the activation of the signal RUN.

At time T7, the basic signal CLK goes high, and address signal bits Add0–Addm are latched in the address storage unit ADM as a row address signal X2 since the signal ALE is at a high level.

When the basic signal CLK goes low at time T9, address signal bits Add0–Addm are latched into the address storage unit ADM. At time T9, the internal basic signal RAS is active at a high level, and a memory cell accessing is performed in accordance with the previously supplied address signals X1 and Y1. Thus, even if the signal RUN is activated at time T9, such activation is ignored. Only address latching is performed.

At time T11, a row address signal X3 is latched into the address storage unit ADM. When the signal RUN is activated at time T13, a memory cell selection according to the address signals X2 and Y2 is started. At this time, a column address signal Y3 is also latched into the address storage unit ADM.

Then, the similar operations are repeated in which a row address signal is latched at the rising of the basic signal CLK and a column address signal is latched at the falling of the signal CLK while the signal ALE is active at a high level.

In the above description, the signal RAS goes high when the signal RUN is at a high level at the falling edge. If the signal RAS is already at a high level, no new operation is carried out. However, the signal ALE may be also employed such that the signal RUN is ignored while the signal ALE is at a low level.

Figure 5:
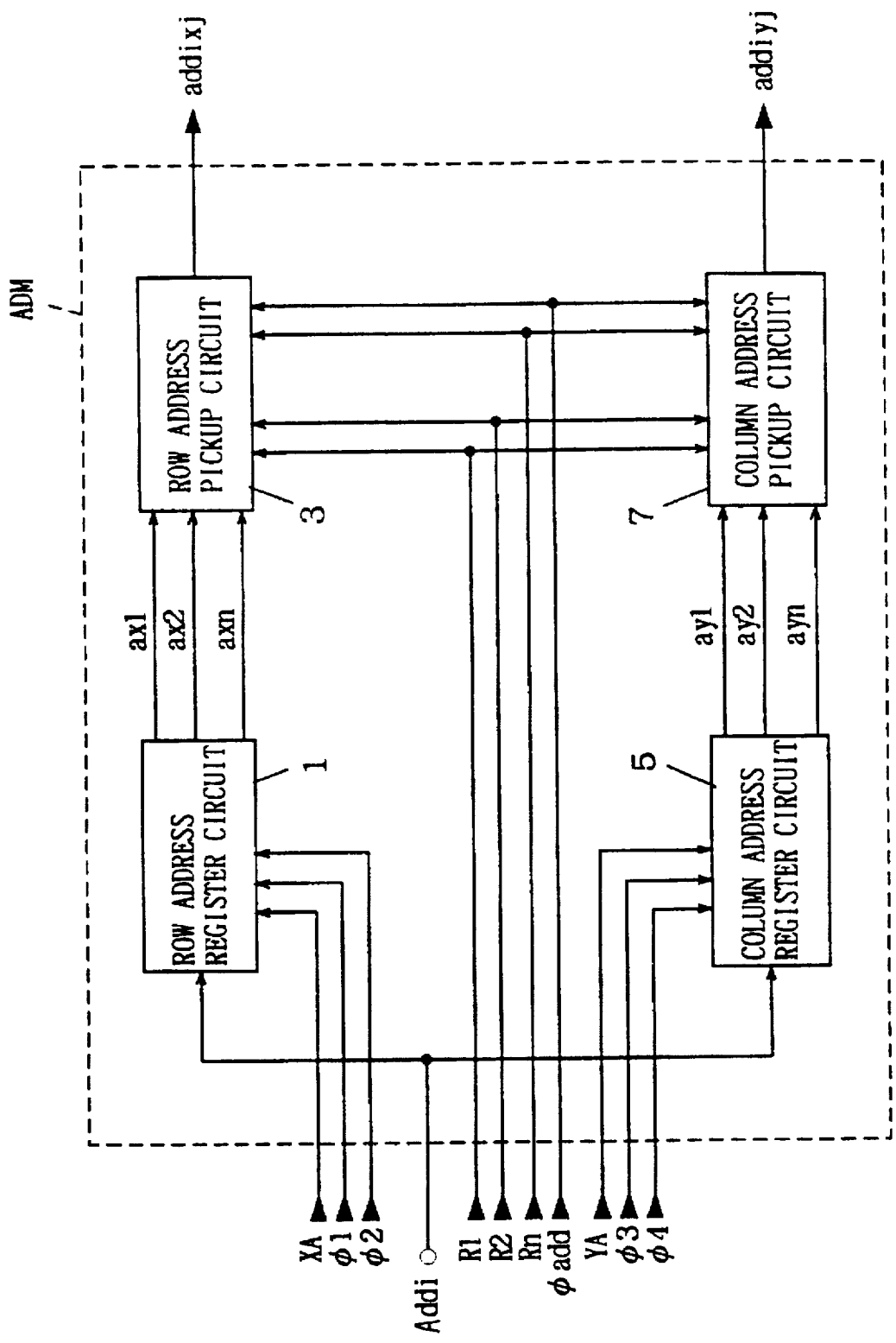
FIG. 5 shows a schematic detailed arrangement of the address storage unit shown in FIG. 4.

FIG. 5 shows a schematic detailed structure of the address storage unit ADM. Referring to FIG. 5, the address storage unit ADM includes a row address register circuit 1 responsive to signals XA, $\phi1$ and $\phi2$ for latching sequentially applied address signals Addi as row address signals, a row address pickup circuit 3 responsive to signals R1, R2, - - - Rn and $\phi$add for picking up an output of the circuit 1 to generate an internal row address signal addxj, a column address register circuit 5 responsive to signals YA, $\phi3$ and $\phi4$ for sequentially latching applied address signals Addi as column address signals, and a column address pickup circuit 7 responsive to the signals R1–Rn and $\phi$add for picking up an output of the circuit 5 to generate a column address signal addiyj. Here, in FIG. 5, a structure for an address signal bit Addi is representatively shown, and the shown arrangement is provided for each of address signal bits Add0–Addm.

Figure 6:
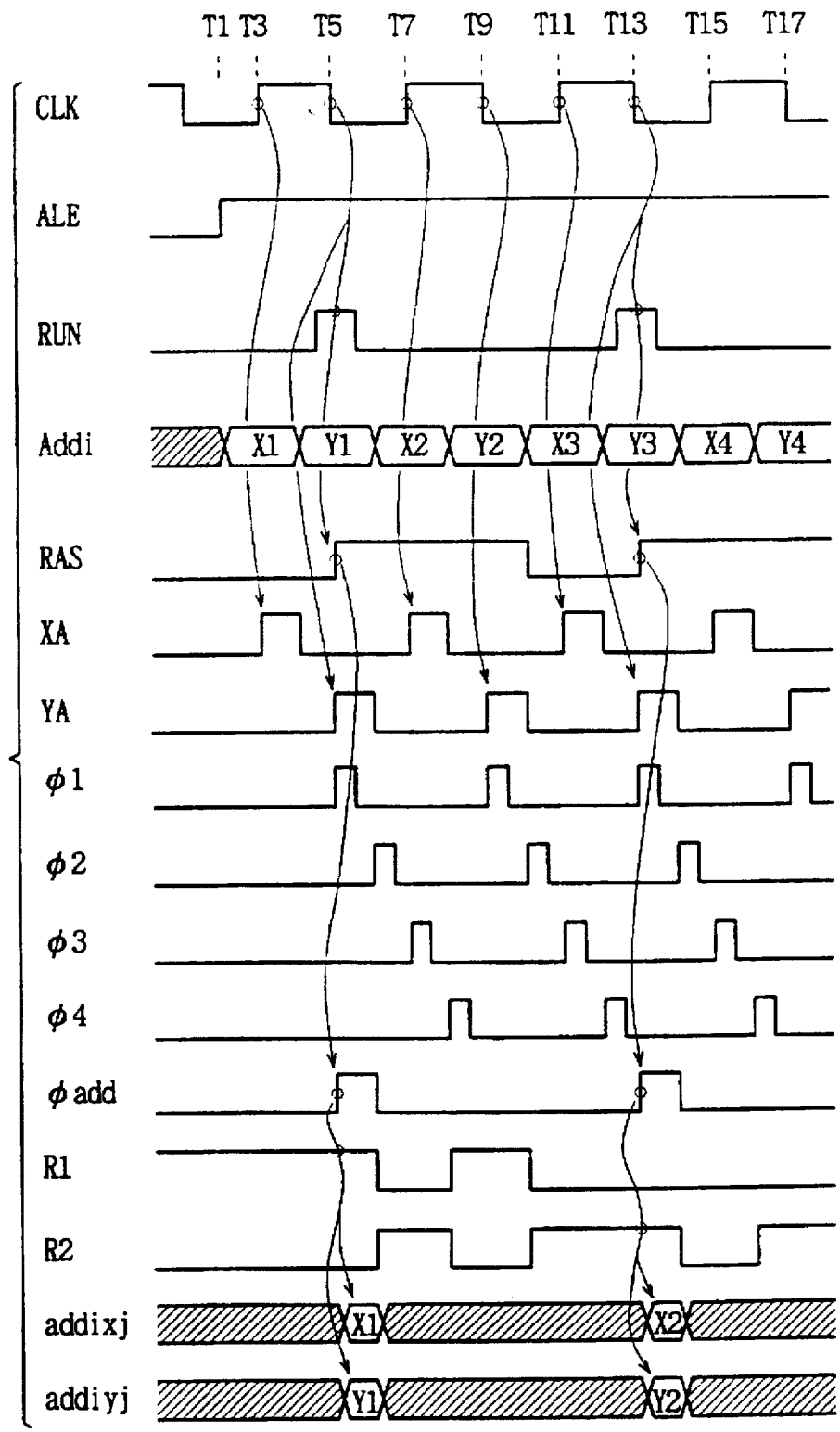
FIG. 6 is an operating waveform diagram showing an operation of the address storage unit of FIG. 5.

Row address register circuit 1 includes shift register latches as described later and supplies in parallel the latched address signal bits ax1–axn. Similarly, column address shift register circuit 5 includes shift register latches and supplies the latched address signal bits ay1–ayn in parallel. Now, operation of the address storage unit ADM will be described with reference to FIG. 6.

When the signal ALE is inactive at a low level, all the control signals to the unit ADM from the controller CNT are at an inactive low time T1, address incorporation operation is enabled. When the basic signal CLK goes high at time T3, the signal XA is activated and the row address register circuit 1 latches the address signal Addi as a row address signal X1.

When the basic signal CLK goes low at time T5, the signal YA is activated and the column address register circuit 5 latches the address signal as a column address signal Y1. The signals $\phi1$–$\phi4$ are sequentially activated, and the register circuits 1 and 5 shift the latched address signal by one stage for preparation to a next latching of address signals.

At time T5, the signal RUN is also activated, and responsively the internal basic signal RAS is activated. In response to the activation of the signal RAS, the signal $\phi$add is activated and the pickup circuits 3 and 7 are enabled. The pickup circuits 3 and 7 select the address signals X1(ax1) and Y1(ay1) in response to the signal R1 at an active level to supply the address signals X1 and Y1 (addixj and addiyj) to the row and column decoders in parallel.

At time T7, in response to the rising of the basic signal CLK, the row address register circuit 1 latches the address signal as a row address signal X2. At time T9, in response to the falling of the signal CLK, the register circuit 5 latches the address signal as a column address signal Y2. The address signals X2 and Y2 are shifted in the register circuits 1 and 5 in response to the signals $\phi1$–$\phi4$. In this period, the signal RAS is at a high level, and no address signal supply is carried out.

At times T11 and T13, in response to the rising and falling of the signals CLK, address signals are latched in the register circuits 1 and 5 as row and column address signals, respectively.

At time T13, the signal $\phi$add is activated in response to the activation of the signal RAS, and the address signals X2 and Y2 are picked up by the circuits 3 and 7 to be supplied to the decoders, respectively, in accordance with the signal R2. As described later, one of the signals R1–Rn is activated.

By repeating the above operations, memory selection according to the latched address signals are sequentially carried out in accordance with the signal RAS.

Figure 7:
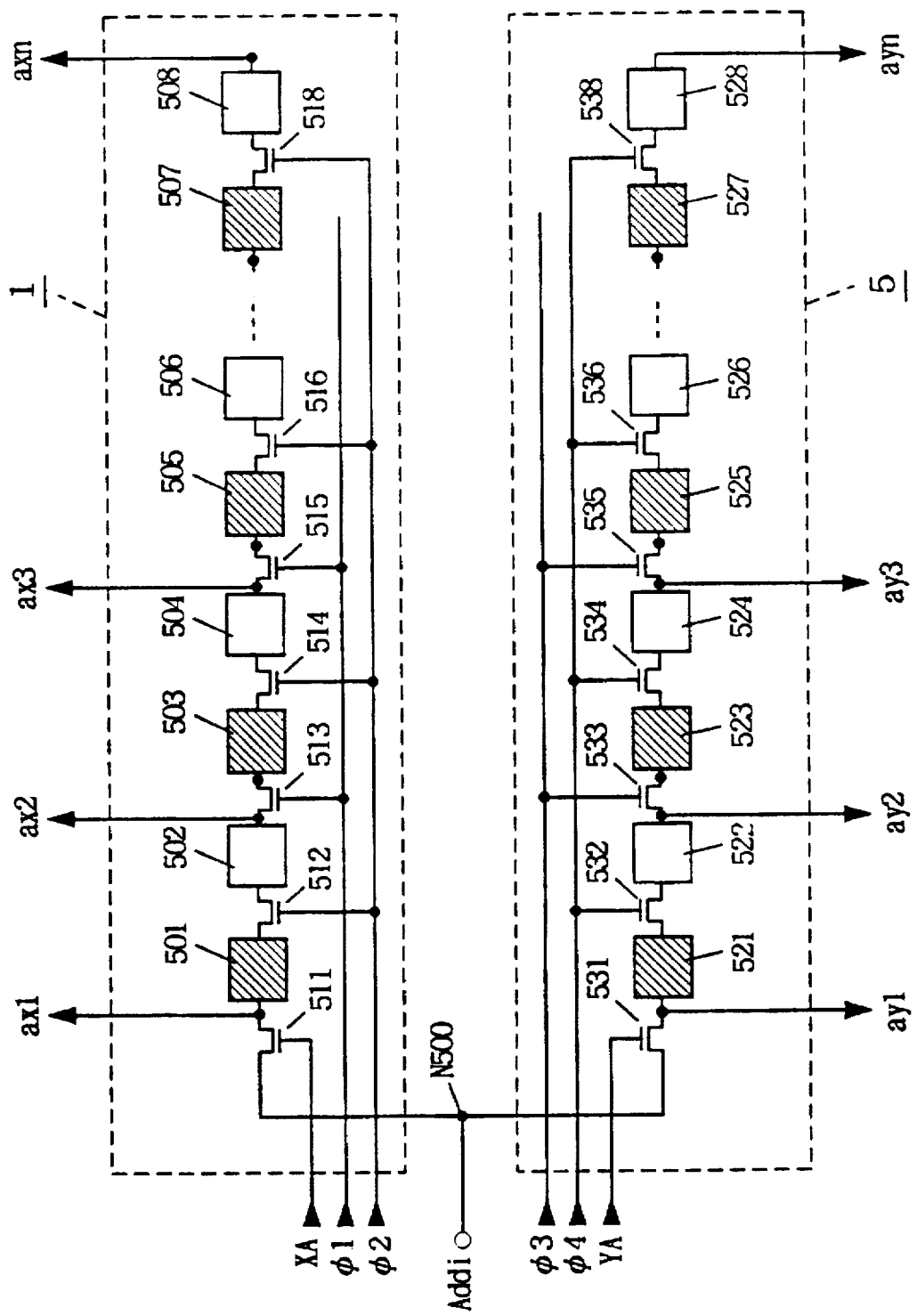
FIG. 7 shows a detailed arrangement of the address register circuits shown in FIG. 5.

FIG. 7 shows a specific structure of the register circuits 1 and 5 shown in FIG. 5. Referring to FIG. 7, the register circuit 1 includes a switching transistor 511 formed of an n channel MOS (insulated gate type) transistor and responsive to the signal XA for passing the address signal Addi therethrough, a plurality of latches 501–508 for latching applied signals, and a plurality of switching transistors 512–518 provided between adjacent latches. Switching transistors 512–518 receive alternately the control signals $\phi2$ and, $\phi1$ at their gates. Latches 501–508 constitute a shift register latch circuit, and an address signal bit ax1 is generated at the input of the latch 501, and address signal bits ax2–axn are generated at the outputs of latches 502, 504, - - - 508 at even number stages.

Figure 8:
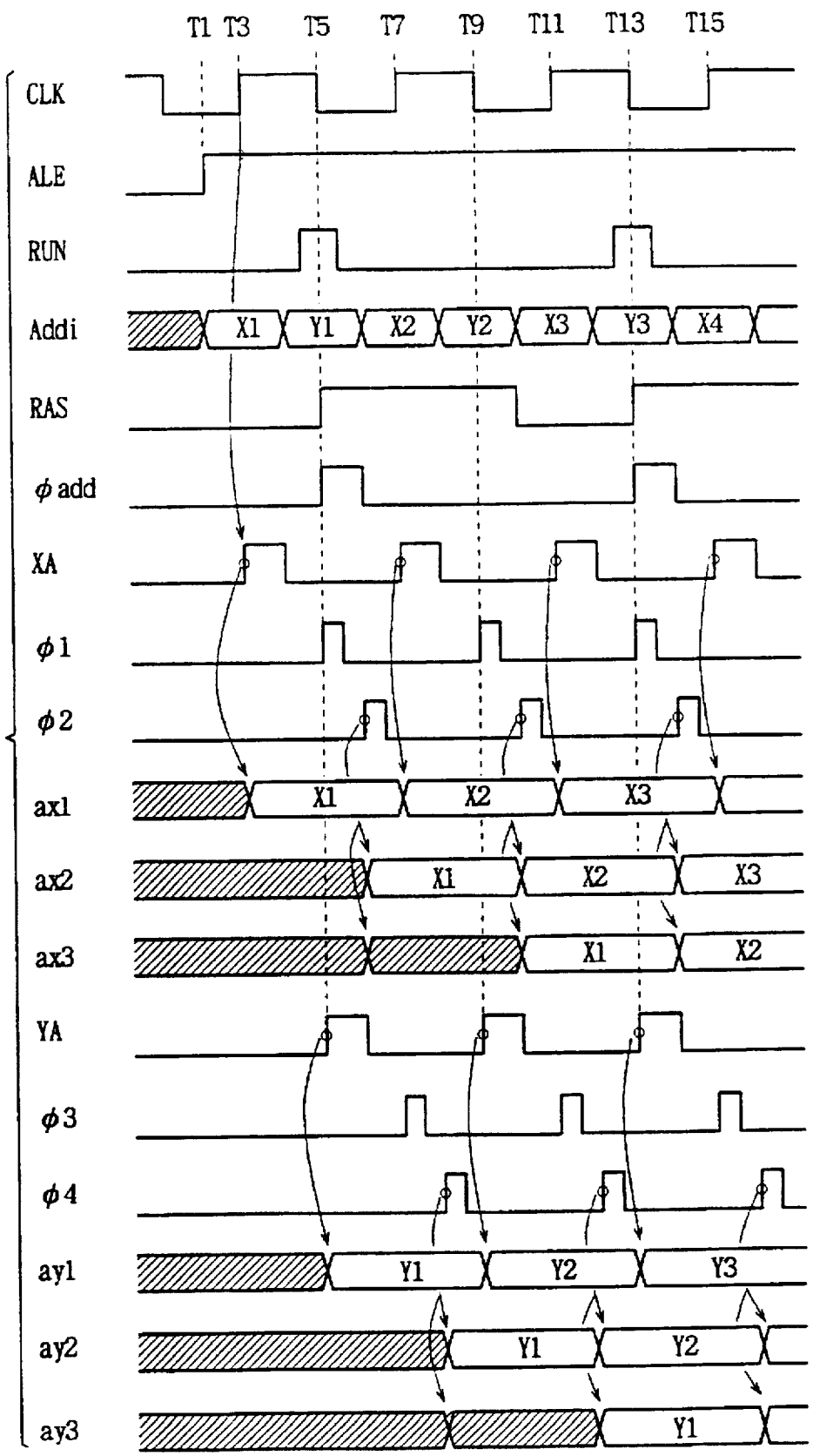
FIG. 8 is an operating waveform diagram showing an operation of the circuits of FIG. 7.

The column register circuit 5 includes a switching transistor 531 responsive to the signal YA for transferring the address signal bit Addi at node N500, a plurality of latches 521–528, and a plurality of switching elements 532–538 provided between adjacent latches. Switching transistors 532–538 receives alternately the signals $\phi4$ and $\phi3$ at their gates. The latches 521–528 and the switching transistors 531–538 constitute a shift register latch circuit. The column address signal bit ay1 is generated at the input of the latch 521, and address signal bits ay2–ayn are generated at the outputs of the latches at the stages of even numbers. Now, the operation of the circuits of FIG. 7 will be described with reference to the operating waveform diagram of FIG. 8.

The signal ALE goes high at time T1. At the rising edge of the basic signal CLK at T3, the signal XA is activated (at H level) for a predetermined period, the switching transistor 511 is turned on to transfer the address signal Addi to the latch 501. The address signal axi corresponds to the row address signal x1. The signals $\phi1$ and $\phi2$ are then sequentially activated. The contents of latches 502, 504 at even number stages are transferred to adjacent latches 503, 505 - - - 507, and then the contents of the latches 503, 505, - - - 507 are transferred to adjacent latches at even number stages. Thus, the address signal ax2 corresponds to the row address signal x1.

At times T7 and T11, address signals are latched as row address signals x2 and x3, respectively, in response to the signal XA generated in response to the rising of the signal CLK. The row address signals are then shifted by the signals φ1 and φ2, and the address signals ax3, ax2 and ax1 correspond to the row address signals x1, x2 and x3, respectively.

In the column address register circuit 5, at each falling of the signal CLK, an address signal Addi is latched as a column address signal and is shifted by the signals φ3 and φ4. At time T13, the address signals ay3–ay1 correspond to the column address signals Y1–Y3, respectively.

Figure 9:
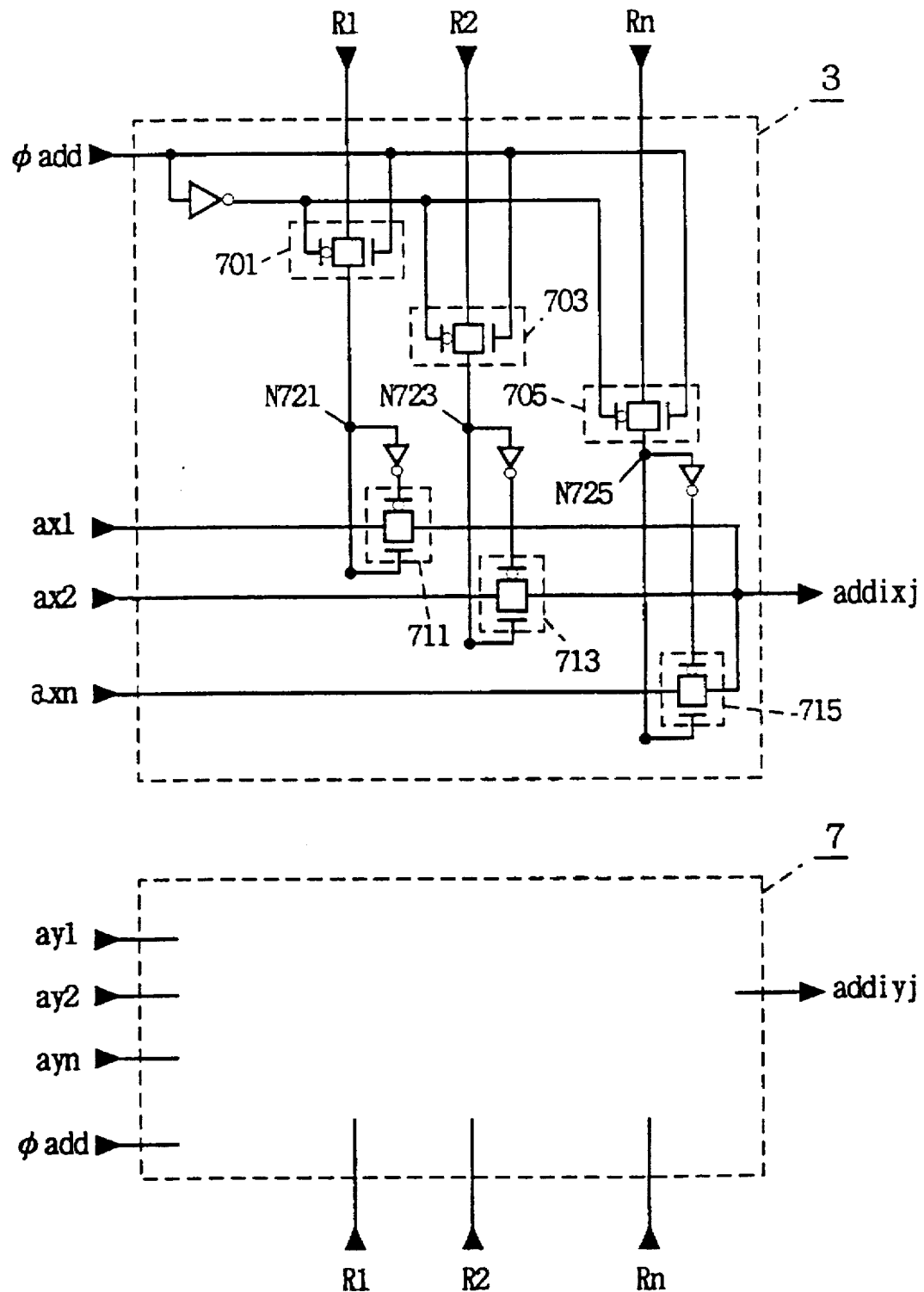
FIG. 9 shows a detailed arrangement of the pickup circuits of FIG. 5.

FIG. 9 shows a specific structure of the row address pickup circuit 3 shown in FIG. 5. The pickup circuit 7 has the same configuration as the circuit 3, and only a block of the pickup circuit 7 is shown in FIG. 9.

Figure 10:
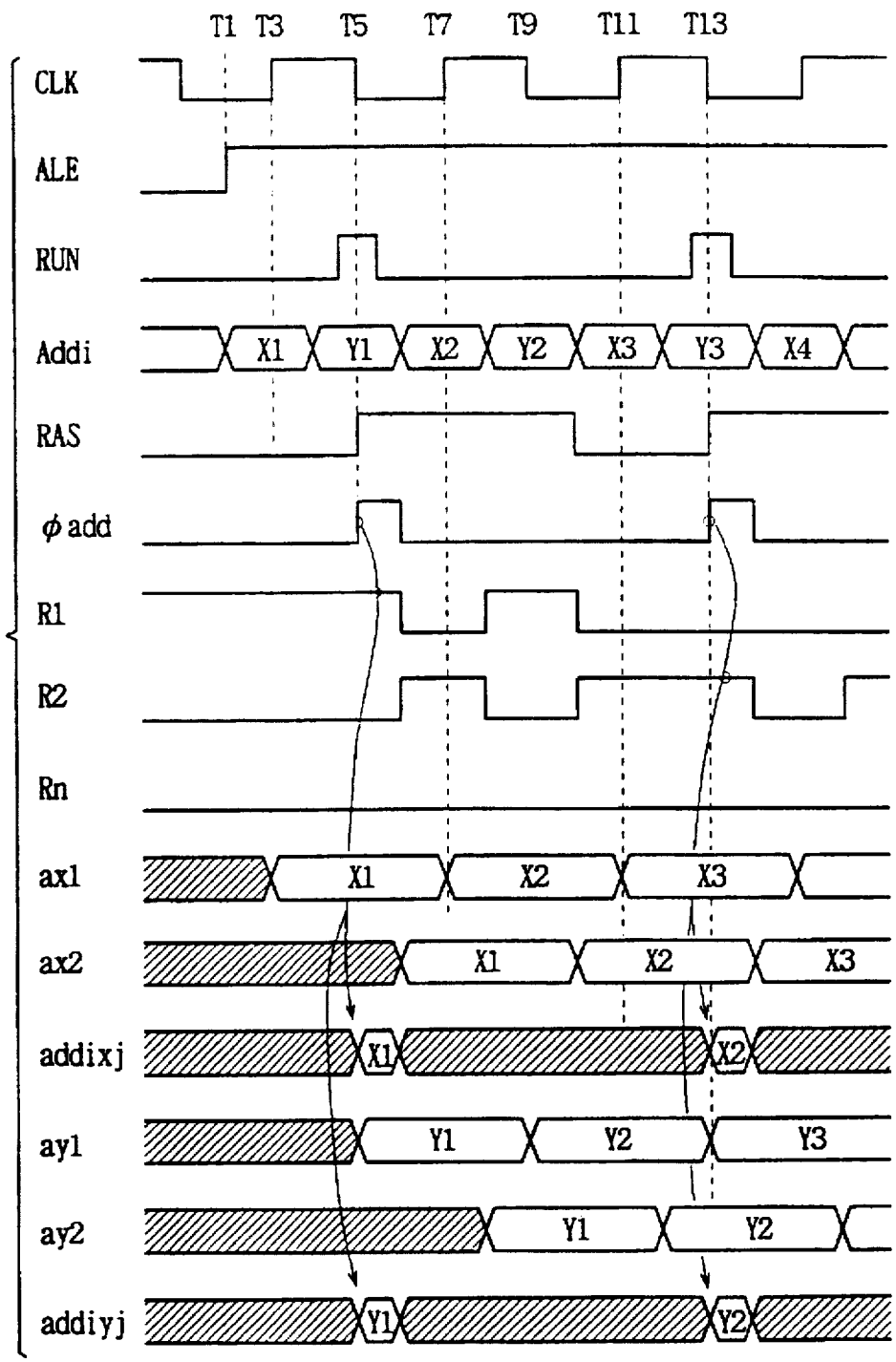
FIG. 10 is an operating waveform diagram showing an operation of the circuits of FIG. 9.

Referring to FIG. 9, the pickup circuit 3 includes CMOS transmission gates 701–705 responsive to the signal φadd for transferring the signals R1–Rn, and CMOS transmission gates 711–715 provided corresponding to CMOS transmission gates 701–705 and to address signals ax1–axn and responsive to the R1–Rn supplied through corresponding CMOS transmission gates 701–705 to transfer corresponding address signals ax1–axn. Only one of the CMOS transmission gates 711–715 becomes conductive, and an address signal bit axibj is generated. Now, an operation of the pickup circuits 3 and 7 will be described with reference to an operating waveform diagram of FIG. 10.

The signal ALE goes high at time T1 and address incorporations are carried out at the rising and falling of the basic signal CLK at times T3 and T5.

At time T5, the signal φadd goes high, and CMOS transmission gates 701–705 are rendered conductive, and signals R1–Rn are applied to control electrodes of CMOS transmission gates 711–715. The signal R1 is at a high level and the other signals R2–Rn are all at a low level. Thus, CMOS transmission gate 711 is turned on to transfer the address signal ax1 as the address signal bit addixj.

Similarly, in the column address pickup circuit 7, the address signal ay1 is selected to be supplied as the address signal bit addiyj in accordance with the signal R1. Thus, the incorporated address signals X1 and Y1 are supplied to the row and column decoders in parallel.

At time T13, the signal φadd is activated, and then the address signal ax2 and ay2 are selected by the signal R2 at a high level. Thus, the address signals x2 and y2 are transferred to the decoders.

Figure 11:
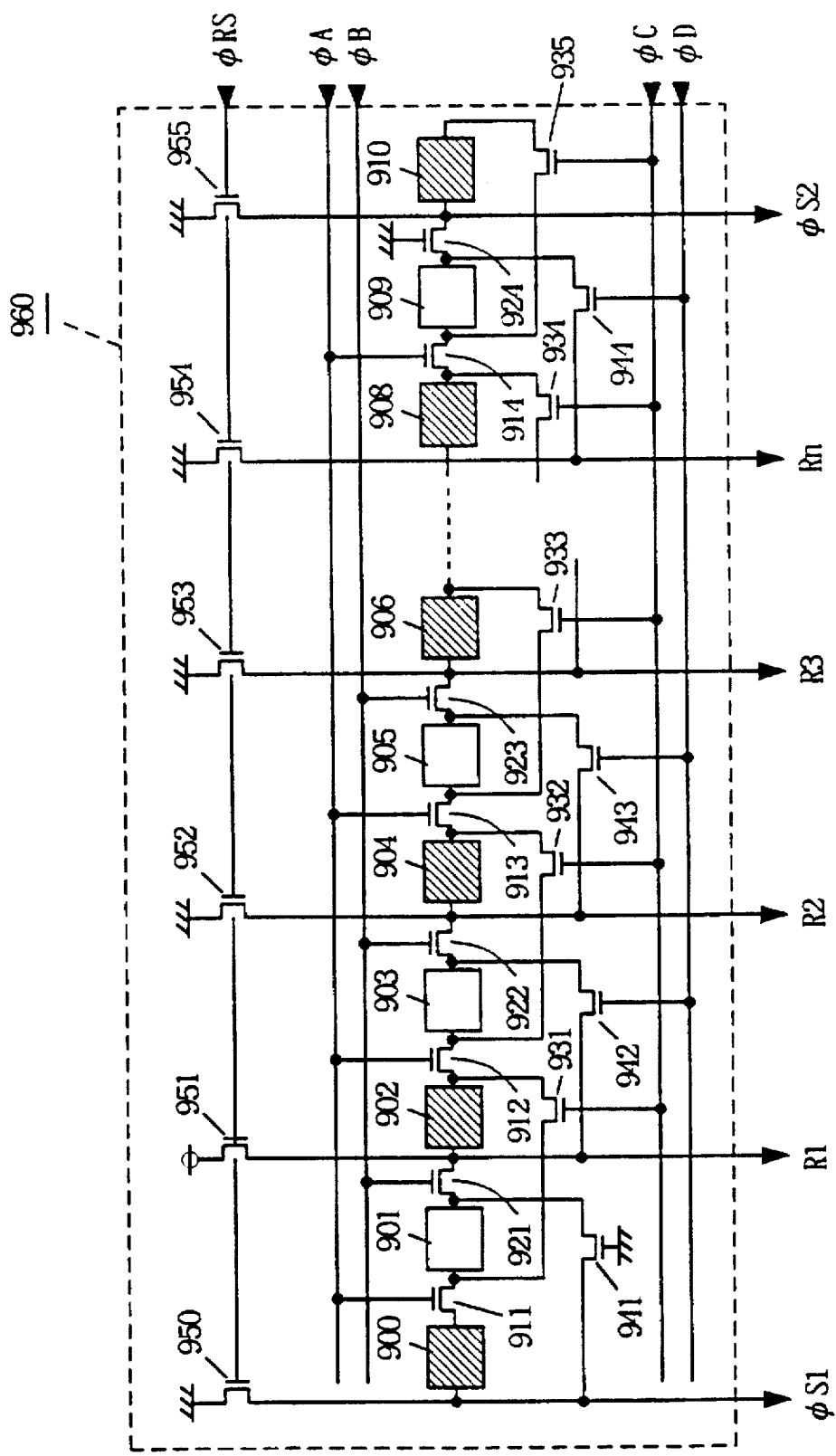
FIG. 11 shows a detailed arrangement for generating address pickup control signals.

FIG. 11 shows a specific structure of the circuit generating the address pickup control signals R1–Rn. Referring to FIG. 11, the circuit 960 includes a plurality of latches 900–910, a plurality of switching transistors 911–914 and 921–924 alternately arranged between adjacent latches, a plurality of switching transistors 931–935 responsive to a control signal φc for electrically connecting the outputs of the latches 902, 904 - - - at the stages of odd numbers to the inputs of the latches 901, 903 - - - at the stages of even numbers, a plurality of switching transistors 942–944 responsive to a control signal φD for connecting the outputs of the latches 903, 905 - - - at the stages of even numbers to the inputs of the latches 901, 903, - - - at the stages of even numbers, and switching transistors 950–955 responsive to a reset signal for resetting the signals φS1, R1–Rn and φS2.

The switching transistors 911–914 are made conductive in response to a control signal φA, and the switching transistors 921–924 are rendered conductive in response to a control signal φB. The signals φS1, R2–Rn and φS2 are reset to L level, while the signal R1 is reset to H level. The signals R1–Rn are generated at the inputs of the latches 902, 904, - - - at the stages of odd numbers. The signal φS1 is generated at the input of the latch 900, and the signal φS2 is generated at the input of the latch 910.

Figure 12:
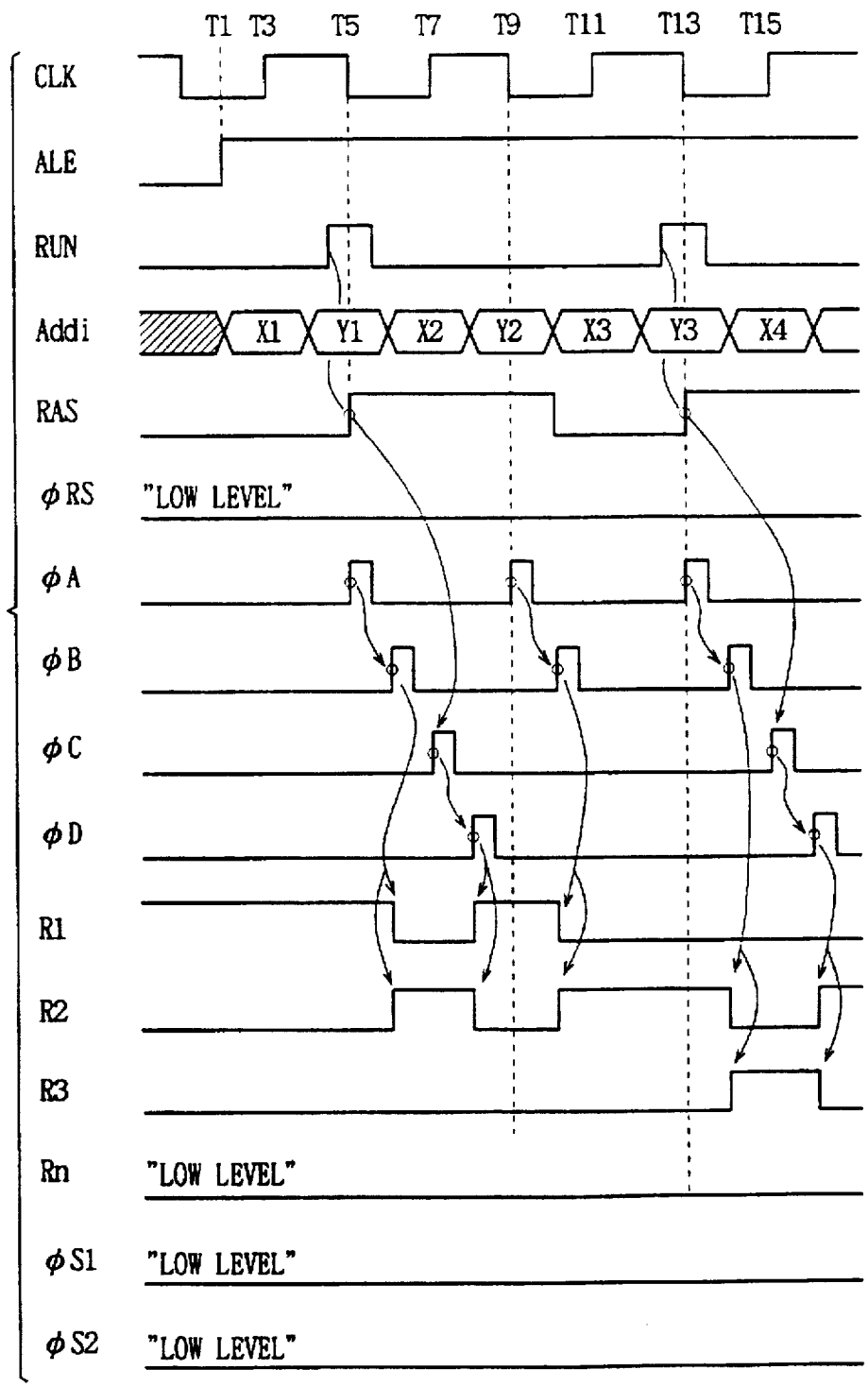
FIG. 12 is an operating waveform diagram showing an operation of the arrangement of FIG. 11.

The output of the latch 901 coupled to the input of the latch 900 through MOS transistor 941 serving as a resistor. The output of the latch 909 is coupled to the input of the latch 910 through MOS transistor 924 serving as a resistor. Now, the operation of the circuit 960 will be described with reference to an operating waveform diagram of FIG. 12.

The reset signal φRS is made active upon initialization, and the signal R1 is at a high level, and the signals φS1, R2–Rn and φS2 are all at a low level.

The signal ALE goes high at time T1, and at the rising and falling of the signal CLK at times T3 and T5, address signals x1 and y1 are latched, respectively. The signals φA and φB are then activated sequentially. Transistors 911–914 are first made conductive and the contents of the latches 900–902 - - - at the odd number stages are transferred to the adjacent latches 901, 903, - - - 909 at even number stages. Then, transistors 921–924 are made conductive, and the contents of the latches 901, 903, - - - 907 are transferred to the adjacent latches 902, 904 at odd number stages. Thus, the signal R1 goes low, and the signal R2 goes high. The signals R2–Rn and φS2 remain low.

At time T5, the signal RUN goes high, and memory accessing according to address signals X1 and Y1 are carried out in response to the activation of the signal RAS, the signal φC and φD are sequentially made high. Transistors 931–935 are first rendered conductive, and then the transistors 942–944 are made conductive. That is, shifting of the signals R1–Rn in the opposite direction to the direction of shifting by the signals φA and φB are effected, and the signal R1 goes high, and the signal R2 goes low.

At times T7 and T9, the address signals X2 and Y2 are latched, and the signals φA and φB are sequentially activated. Responsively, the signal R1 goes low and the signal R2 goes high. Since the signal RUN is not activated, the signals φC and φD are not made active.

At time T13, address signals X3 and Y3 are latched, and the signal RAS is activated in response to the signal RUN. Since the signal R2 is active at a high level, memory accessing according to the address signals X2 and Y2 are carried out. Then, the signals φA–φD are sequentially activated, and the signal R2 once goes low and then goes high, and the signal X3 once goes high and then goes low. In this state the signal R2 is in a state for selecting the address signals X3 and Y3.

If only address incorporation is carried out and the signal RUN is never activated, the signal φS2 goes high indicating that the address register circuits 1 and 5 are full of available address signals and there is no register for storing a new available (valid) address signal address latch into the unit ADM is inhibited irrespective of the state of the signal ALE when the signal φS2 goes high. This construction is readily implemented by forcedly deactivating the signals XA and YA in response to the signal φS2 being high.

If only the signal RUN is repeatedly applied while the signal ALE is at a low level, available address signals are all read out, and then the signal φS1 goes high. That is, if the signal φC and φD are activated while the signal R1 is at a high level, the signal φS1 goes high and the signal R1 goes low. This state indicates that no available address signal is present in the address register circuits 1 and 5. Thus, the generation of the signal RAS is inhibited when the signal φS1 is at a high level. This arrangement is readily implemented by a NOR gate receiving the signals RAS and φS1.

The signals φA and φB can be generated by a circuit responsive to the signals ALE and CLK, and the signals φC and φD can be readily generated by a circuit responsive to the signal RAS.

FIGS. 13A–13D show an example of the circuits for generating the signals φA–φD, φ1–φ4 and φ4.

Figure 13A:
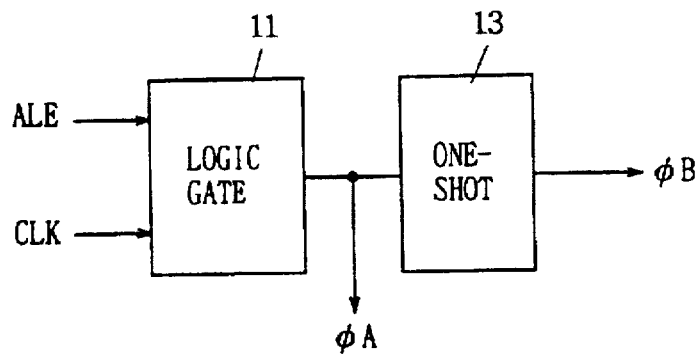
FIGS. 13A–13D show exemplary arrangement for generating transfer control signals used in the circuits of FIG. 9 and FIG. 11.

Referring to FIG. 13A, a logic gate 11 receives the signals ALE and CLK, enabled when the signal ALE is active at a high level and generates a one-shot pulse signal φA in response to the falling of the basic signal CLK. A one-shot pulse generator 13 generates a one-shot pulse signal φB in response to the deactivation of the signal φA. The one-shot pulse generator may be replaced with a delay circuit.

Figure 13B:
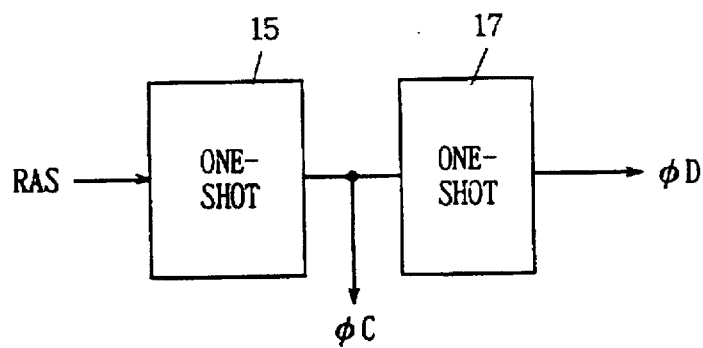

Referring to FIG. 13B, a one-shot pulse generator 15 generates a one-shot pulse signal φC in response to the activation (the rising) of the internal basic signal RAS. A one-shot pulse generator 17 generates a one-shot pulse signal φD in response to the deactivation of the signal φC. The one-shot pulse generator 17 may be replaced by a delay circuit.

Figure 13C:
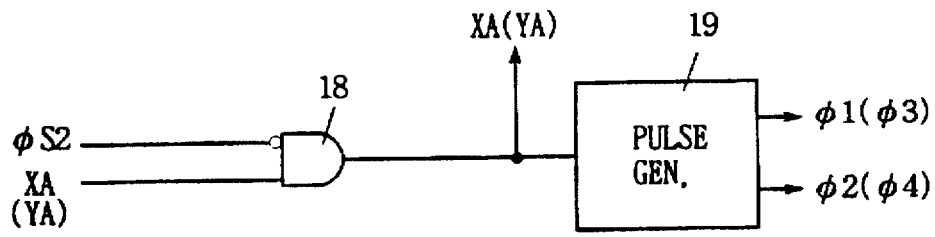

Referring to FIG. 13C, a gate 18 receives the signals φS2 and XA. The signals φ3 and φ4 are generated by the same circuit configuration as that shown in FIG. 13C, and the signals YA, φ3 and φ4 are shown with parentheses. Gate 18 serves as a buffer when the signal φS2 is at a low level, and passes the signal XA(YA) therethrough. Gate 18 is disabled when the signal φS2 is at high level, and generates a low level signal XA. That is, the activation of the signal XA(YA) is inhibited when the signal φS2 is at a high level, and address incorporation operation in the address storage unit ADM is inhibited.

A pulse generator 19 sequentially generates the one-shot pulse signals φ1(φ3) and φ2(φ4) in response to the activation (the rising) of the output signal XA of the gate 18.

Figure 13D:
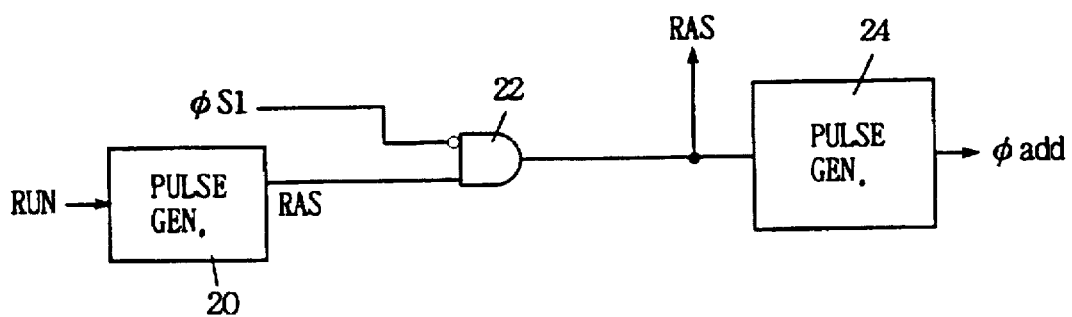

Referring to FIG. 13D, a pulse generator 20 generates a one-shot pulse signal RAS in response to the activation of the signal RUN. A gate 22 receives the signal φS1 at a false input and the output signal RAS of the pulse generator 20 at a true input. Gate 22 passes the output signal RAS of the pulse generator 20 therethrough when the signal φS1 is at a low level. When the signal φS1 is at a high level, gate 22 is disabled, and the output signal RAS from gate 22 is kept at a low level. A pulse generator 24 generates or activates the signal φadd in response to the output signal RAS from the gate 22. Only when a memory cell selection operation is enabled, the signal φadd is activated, and address signals are supplied to the row and column decoders.

Here, the signal RAS determines the operation timings of both of the row selection operation and the column selection operation.

Figure 14:
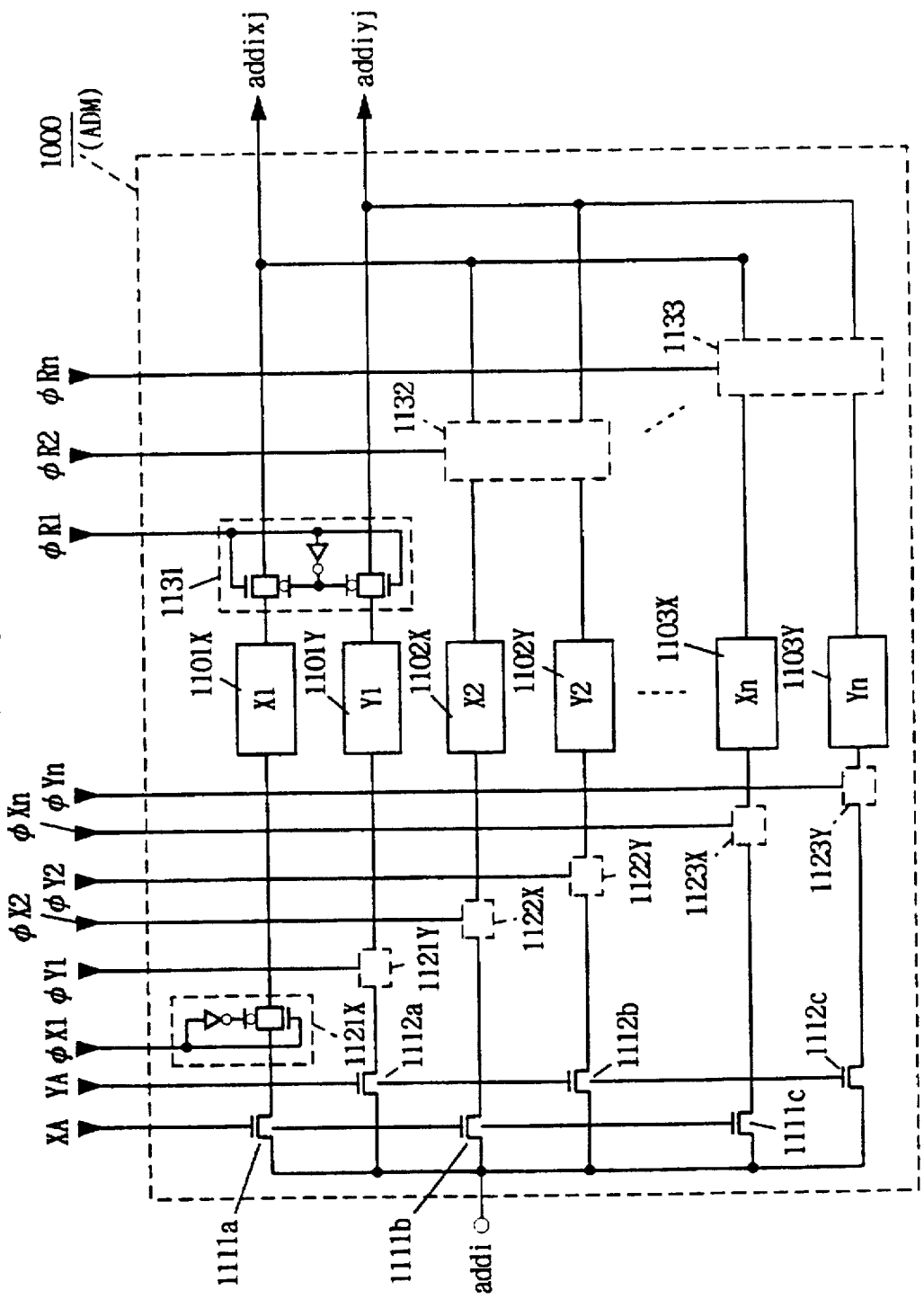
FIG. 14 shows a schematic arrangement of the address storage unit according to another embodiment of the present invention.

FIG. 14 shows another structure of the address storage unit ADM (1000). Referring to FIG. 14, the address storage unit 1000 includes a plurality of registers 1101X–1103X for storing row address signal bits X1–Xn, and a plurality of registers 101Y–1105Y for storing columns address signal bits y1–yn. Registers 101X–105X and 1101Y–1103Y are provided in parallel.

The address storage unit 1000 further includes switching transistors 1111a–1111c provided for the registers 1101X–1103X and responsive to the signal XA for passing the address signal bit Addi therethrough, switching transistors 1112a–1112c provided for the registers 1101Y–1103Y and responsive to the signal YA for passing therethrough the address signal bit Addi, transmission gates 1121x–1123x provided for the registers 1101X–1103X and responsive to control signals φx1–φxn for transferring a latched address signal to corresponding registers 1101X–1103X, and transmission gates 1121Y–1123Y provided for the registers 1101Y–1103Y and responsive to control signals φY1–φYn for transferring a latched address signal to corresponding registers 1101Y–1103Y.

Two adjacent registers are paired to provide a set. More specifically, registers 1101X and 1101Y are paired, and registers 1102X and 1102Y are paired, and registers 1103X and 1103Y are paired.

For the respective pairs of the registers, transmission gates 1131–1133 responsive to control signals φR1–φRn are provided. One of control signals φR1–φRn is made active, and the contents Xi and Yi of paired registers are read out in parallel as address signal bits addixj and addiyj to be supplied to the decoders. The arrangement of FIG. 14 is provided for each respective address signal bit.

Figure 15:
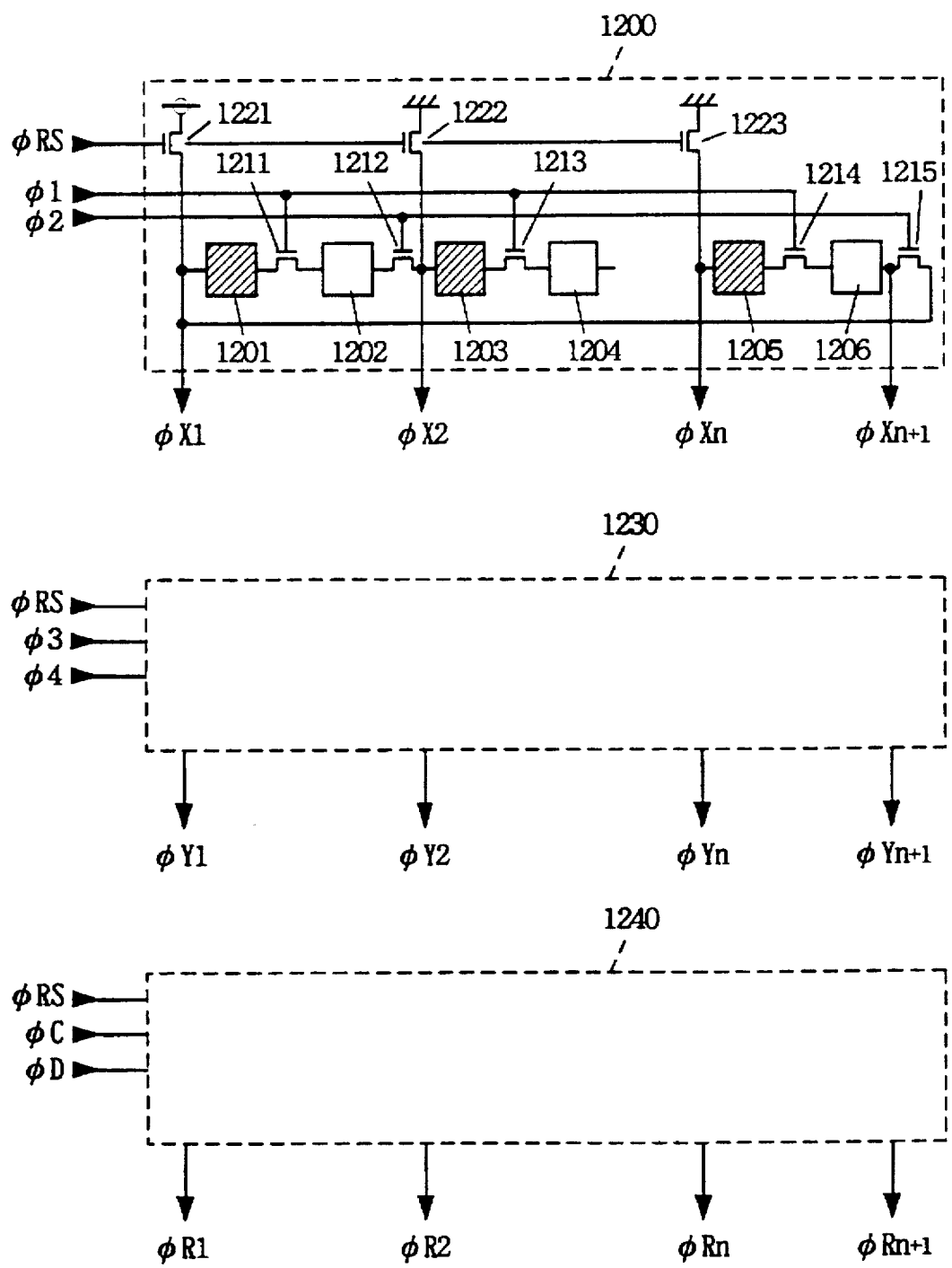
FIG. 15 shows a detailed arrangement for generating control signals used in the arrangement of FIG. 14.

FIG. 15 shows a circuit configuration for generating the control signals shown in FIG. 14. Referring to FIG. 15, a control circuit 1215 generates control signals φX1–φXn+1 in response to the signals φRS, φ1 and φ2, a control circuit 1230 generates the control signals φY1–φYn+1 in response to the signals φRS, φ3 and φ4, and a control circuit 1240 generates the signals φR1–φRn+1 in response to the signals φRS, φC and φD. Since the control circuits 1200, 1230 and 1240 have the same configuration with each other, and a specific configuration of only the control circuit 1200 is representatively shown in FIG. 15.

Control circuit 1200 includes a plurality of latches 1201–1206, and a plurality of switching transistors 1211–1215 provided between adjacent latches. Switching transistors 1211, 1213 - - - 1214 receive the control signal φ1 at their control gates, and switching transistors 1212, - - - 1215 receive the signal φ2 at their control gates. Switching transistor 1215 transfers an output signal of the latch 1206 to the input of latch 1201. The control circuit 1200 is of a ring shift register. The signals φX1–φXn are generated at the inputs of the latches 1201, 1203, - - - 1205 at odd number stages. The signal φXn+1 is generated at the output of the latch 1206.

Switching transistors 1221–1223 are also provided for initializing the signals φX1–φXn+1 in response to the reset signal φRS. The signal φX1 is reset to a high level, while the signals φX2–φXn+1 are reset to a low level.

Figure 16:
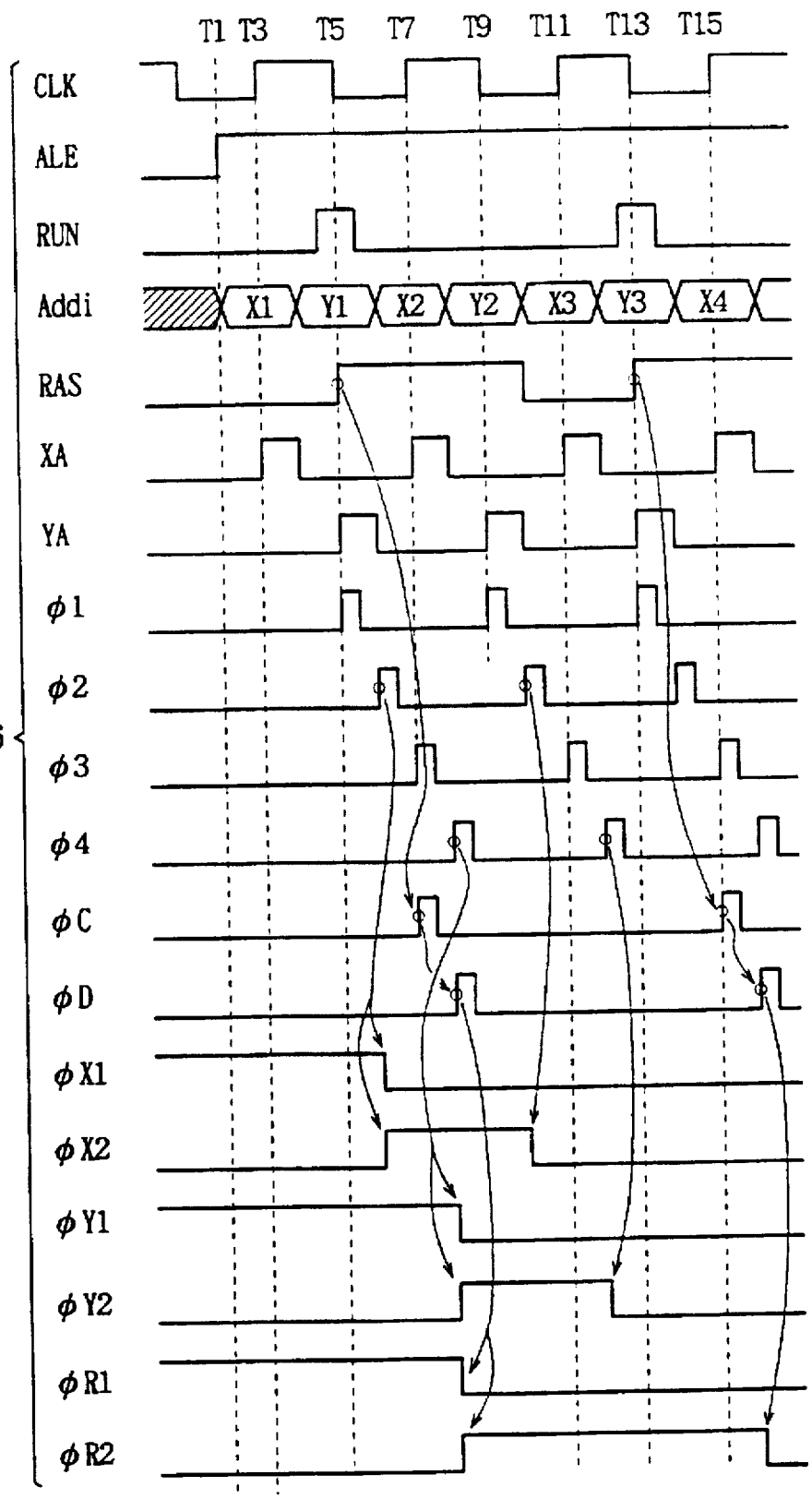
FIG. 16 is an operating waveform diagram showing the operation of the arrangement of FIG. 15.

The signals φXn+1, φYn−1 and φRn+1 are employed for inhibiting the address incorporation operation and memory cell selection operation. Now, the operation of the circuits shown in FIGS. 14 and 15 will be described with reference to an operating waveform diagram of FIG. 16.

At time T1, the signal ALE goes high to enable address incorporation operation. The signals φX1–φXn+1, φY1–φYn+1 and φR1–φRn+1 are already reset, and the signals φX1, φY1 and φR1 are at a high level.

At time T3, the signal XA is activated in response to the rising of the signal CLK. The address signal Addi is stored in the register 110aX through the transistor 1111a and the transmission gate 1121X.

At time T5, the signal YA is activated in response to the falling of the signal CLK, and the address signal Addi is stored in the register 1101Y through the gates 1112a and 1121X.

In response to the activation of the signal XA, the signals φ1 and φ2 are sequentially activated, and the content of the latch 1201 is transferred to the latch 1203. Thus, the signal φX2 goes high, while the signal φX1 goes low because the latch 1201 receives the content of the latch 1205.

Similarly, the signals φ3 and φ4 are sequentially activated in response to the activation of the signal YA, and the signal φY2 goes high and the signal φY1 goes low.

At time T5, the signal RUN is also activated, and the signal RAS is activated, and the contents X1 and Y1 of the registers 1101X and 1101Y are read out to the decoders through the gate 1131. Then, the signals φC and φD are sequentially activated and the signals φR1 and φR2 go low and high, respectively.

At times, T7 and T9, the signals XA and YA are activated, respectively, and the registers 1102X and 1102Y store the address signals X2 and Y2, respectively through the gates 1111b and 1122X, and the gates 1112b and 1122Y. Then, the signals φ1–φ4 are activated, and the signals φX2 and φY2 go low. At this time, the signal RUN is not activated, and the signal φC and φD are not activated, and the signal φR2 remains high.

At time T11 and T13, the signals XA and YA are activated, and the address signals X3 and Y3 are stored in accordance with the signals φX3 and φY3 (not shown). Since the signal φR2 is at a high level at this time, the address signals X2 and Y2 in the registers 1102X and 1102Y are supplied to the decoders. The signals φ1–φ4 are activated and also the signals φC and φD are activated, and the shift operation is carried out in the control circuits 1200, 1230 and 1240, and the signal φR2 goes low.

Figure 17:
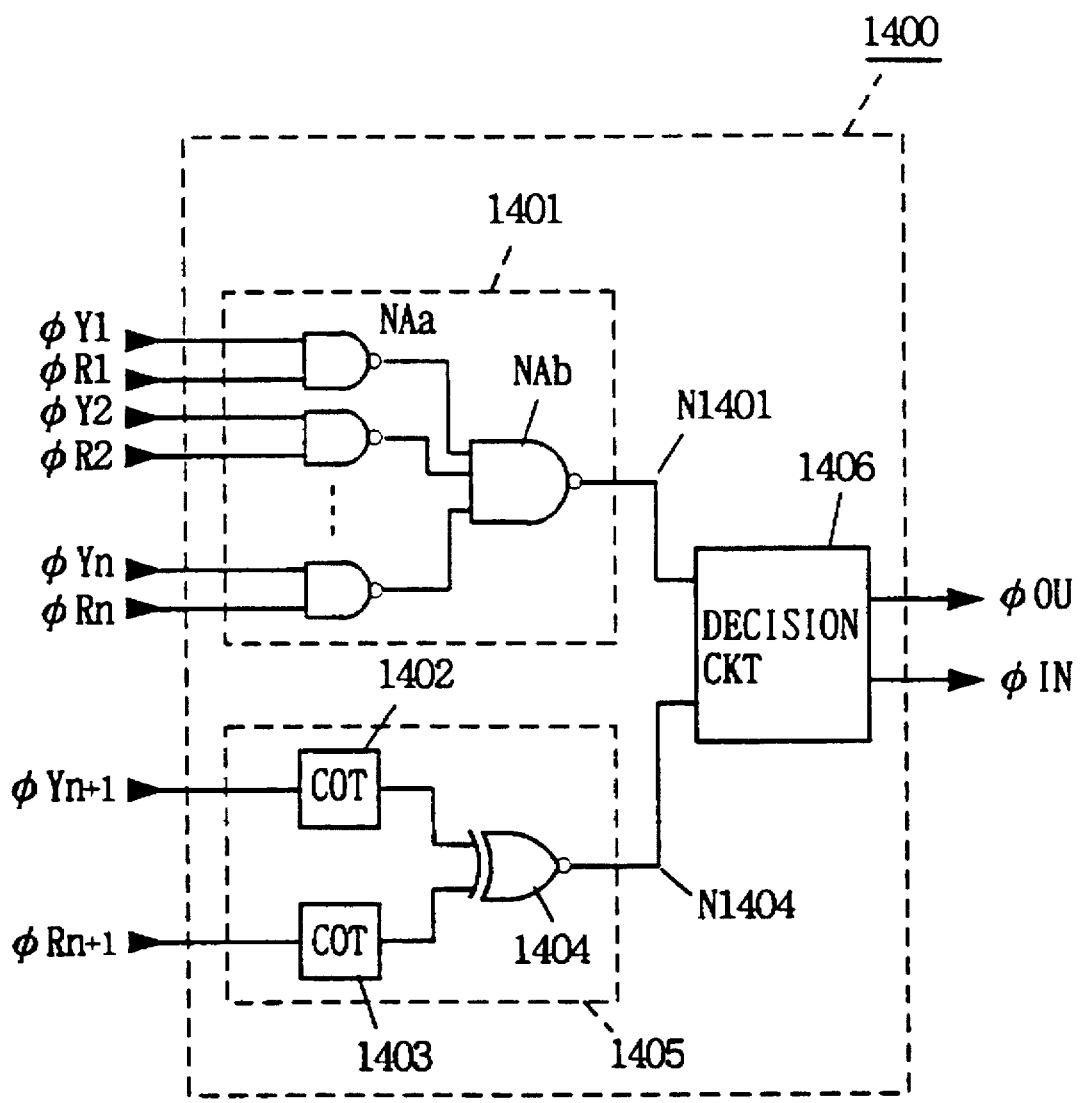
FIG. 17 shows an arrangement for controlling the inhibition of the address incorporation and memory selection operations, used in conjunction with the arrangement of FIG. 15.

FIG. 17 shows an arrangement for inhibiting address incorporation operation and memory cell selection operation. In FIG. 17, the signal φOU is employed for inhibiting the activation of the signal RAS, and the signal φIN is employed for inhibiting the activation of the signals XA and YA.

Referring to FIG. 17, an inhibition control circuit 1400 includes a first detector 1401 detecting that the incorporated address signal is supplied to the decoders in response to the signals φY1–φYn and φR1–φRn, and a second detector 1405 detecting, that the number of feedbacks from the final stage latch to the first stage register is the same in the control circuits 1230 and 1240, and a decision circuit 1406 for generating the signals φIN and φOU in response to the detector 1401 and 1405.

The detector 1401 includes a plurality of NAND gates NAa each receiving signals φYi and φRi (i=1–n), and a NAND gate NAb receiving all the outputs of NAND gates NAa. NAND gate NAa supplies a low level signal only when the signals φYi and φRi both are at a high level. NAND gate NAb supplies a high level signal when one of NAND gates NAa supplies a low level signal. That is, a high level signal from NAND gate NAb indicates that a register for storing an applied address signal is also the register from which an address signal should be read out.

The detector 1402 includes a counter for counting up the number of times of the activation of the signal φYn+1, and a counter for counting up the number of times of the activation of the signal φRn+1, and a coincident detecting gate 1404 for detecting whether the count of the counter 1402 is the same as the count of the counter 1404.

The gate 1404 supplies a high level signal when the counts of the counters 1402 and 1403 are the same with each other. This condition indicates that the number attached to the register in which an applied address signal should be stored is no less than the number attached to the register from which an address signal should be read out.

The decision circuit 1406 activates the signal φIN to inhibit the incorporation of an address signal when the detector 1401 supplies a high level signal indicating φYi=φRi and the detector 1405 also supplies a high level signal, because there is no available register for a newly applied address signal.

The decision circuit 1406 activates the signal φOU when the detector 1401 supplies a high level signal indicating φYi=φRi and the detector 1405 supplies a low level signal and if the signal ALE is in an inactive state, because no available address signal is stored in the storage unit 1000.

Figure 18:
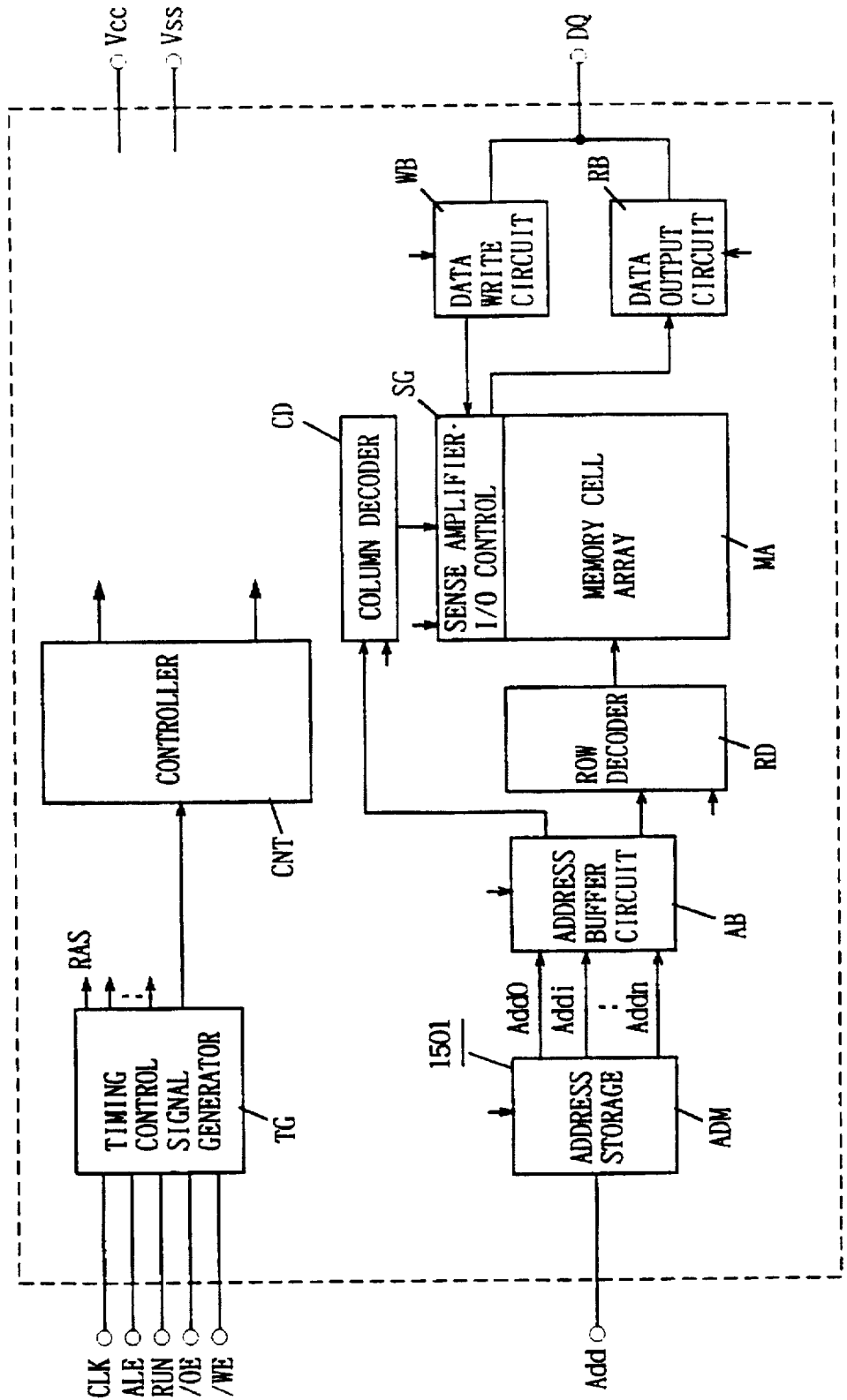
FIG. 18 shows a schematic overall arrangement of a semiconductor memory device according to a further another embodiment of the present invention.

FIG. 18 shows an overall arrangement of a semiconductor memory device according to a further embodiment of the present invention. In the memory device of FIG. 18, an address storage unit (ADM) 1501 receives a row address signal and a column address signal on a bit by bit basis in synchronization with the basic signal CLK. The other components are the similar to those shown in FIG. 3. Now, the operation of the memory device of FIG. 18 will be described with reference to an operating waveform diagram of FIG. 19.

Figure 19:
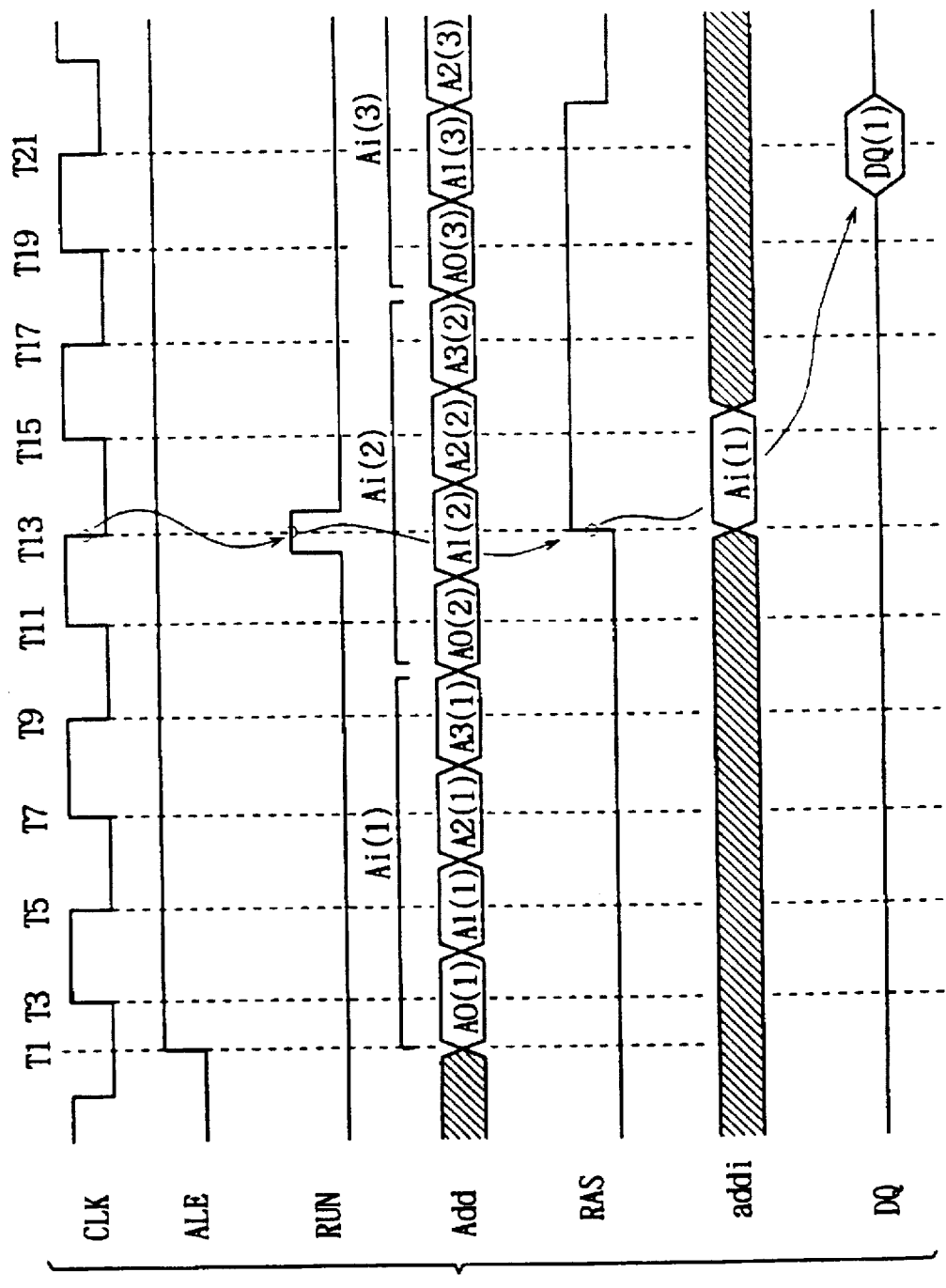
FIG. 19 is an operating waveform diagram showing an operation of the memory device of FIG. 18.

At time T1, the signal ALE goes high. Bits A0(1)–A3(1) of an address signal Ai(1) are sequentially supplied and latched into the address storage unit(ADM) 1501 at respective transitions of the signal CLK. In FIG. 19, an address signal Add of four bits is shown as an example.

At time T11, a first bit A0(2) of another address signal Ai(2) is applied, and the bits A0(2)–A3(2) are sequentially latched at times T11, T13, T15 and T17. At time T13, the signal RUN is activated, and responsively the internal basic signal RAS is activated.

A memory cell selection operation according to the address signal Ai(1) is carried out, and corresponding data DQ(1) is read out.

Figure 20:
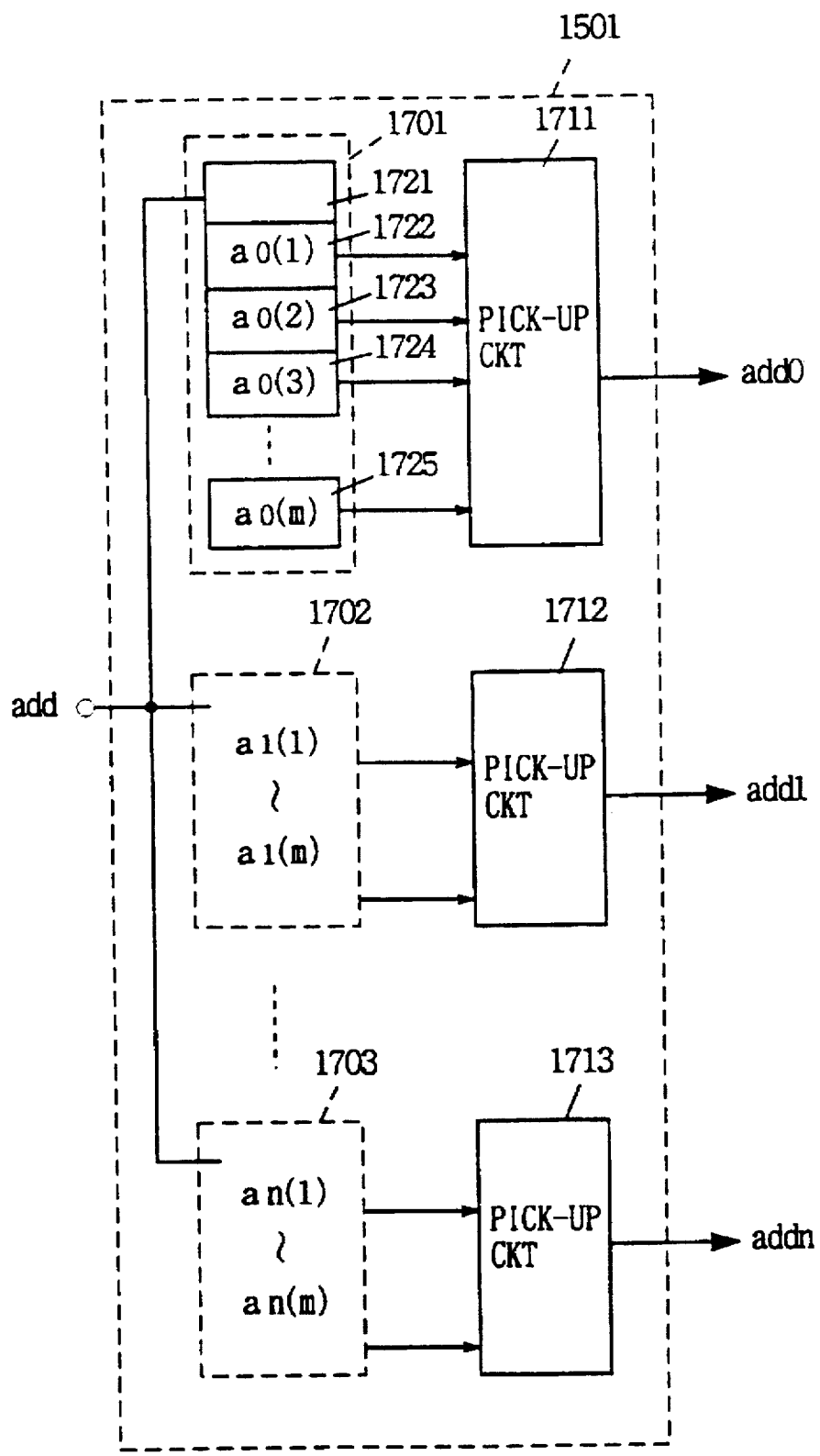
FIG. 20 shows a schematic detailed arrangement of the address storage unit of FIG. 18.

FIG. 20 shows a specific structure of the address storage unit (ADM) 1501 of FIG. 18. Referring to FIG. 20, the address storage unit(ADM) 1501 includes a first bit address register circuit 1701 for storing a first bit a0(k) of an address signal Ai(k), a second bit address register circuit 1702 for storing a second address bit a1(k) of the address signal Ai(k), and an n-th bit address register 1703 for storing an n-th address bit an(k) of the address signal Ai(k).

The circuits 1701–1703 have the same arrangement with each other, and a specific arrangement of the circuit 1701 is representatively shown in FIG. 20. The register circuit 1701 includes a plurality of registers 1721–1725 provided in parallel and storing first address bits a0(1)–a0(m).

The unit (ADM) 1501 further includes pickup circuits 1711–1713 provided corresponding to the circuits 1701–1703 for selecting address bits from the register circuits 1701–1703. From the pick-up circuits 1711–1713, address signal bits add0–addn are supplied in parallel.

In operation, address bits are sequentially stored in the register circuits 1701–1703 at the common location in synchronization with the transitions of the basic signal CLK.

When the signal RUN is activated, the pickup circuits 1711–1713 select address bits from the circuits 1711–1713 at the same location to generate address bits add0–addn.

Although specific arrangement for controlling the operation of the unit 1501 is not shown, such controller can be readily implemented by modifying the controller for FIG. 14 arrangement.

As for the pick up circuits 1711–1713, the arrangements of FIG. 14 and FIGS. 15 and 17 can be employed. The signal XA is sequentially activated for the circuits 1711–1713 and the signal YA is not employed in the arrangement of FIG. 14. Thus, the sequential storage of address bits in the arrangement of FIG. 20 can be readily implemented.

In the arrangement of FIG. 14, a row address signal and a column address signal may Be provided in parallel. In this case, the signal XA and YA are simultaneously changed.

Figure 21:
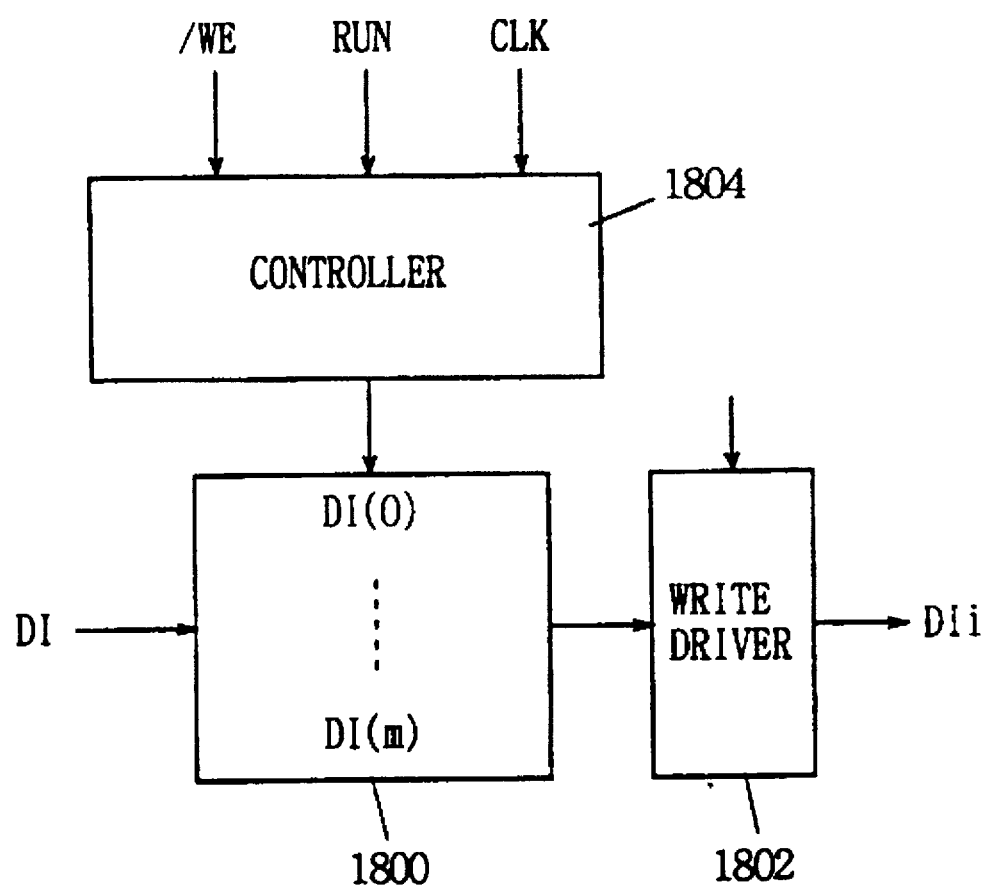
FIG. 21 shows a main portion of a semiconductor memory device according to a still another embodiment of the present invention.

FIG. 21 shows a further another embodiment of the present invention. In the arrangement of FIG. 21, data register 1800 stores write data DI and supplies an internal write data to a write driver 1804 under the control of the controller 1804. The controller 1804 causes the data register 1800 to store the data DI when the write enable signal /WE is active, and to supply an internal data to the write driver 1802 when the signal RUN is activated. The write driver 1802 writes the data into a selected memory cell at a predetermined timing when the signal RAS is activated.

The structures of the address storage unit (ADM) and the controller thereof can be used for the controller 1804 and the data register 1800, where the signal ALE is replaced with the signal /WE.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:

a memory array including a plurality of memory cells;

address storage means for sequentially incorporating address signals each designating at least a part of an address of said memory array to store a plurality of received address signals and for generating an address signal to be decoded from said plurality of received address signals through a predetermined operational processing; and decoding means for receiving and decoding the address signal to be decoded from said address storage means to select an addressed memory cell of said memory cell array.

2. The semiconductor memory device according to claim 1, wherein said address storage means includes a shift register for sequentially receiving the incorporated address signals and shifting the received and incorporated address signals through storage locations thereof at each incorporation of the address signals, and means for selecting a storage location of the shift register in accordance with the number of undecoded valid address signals present in said shift register, to supply an address signal in the selected storage location to said decoding means.

3. The semiconductor memory device according to claim 1, wherein said plurality of memory cells are arranged in rows and columns, and each of said address signals is a row address signal designating a row of memory cells of said memory array.

4. The semiconductor memory device according to claim 1, wherein said plurality of memory cells are arranged in rows and columns, and each of said address signals is a column address signal designating a column of memory cells of said memory array.

5. The semiconductor memory device according to claim 1, wherein said plurality of memory cells are arranged in rows and columns, and each of said address signals includes a row address signal designating a row of memory cells of said memory array and a column address signal designating a column of memory cells of said memory array, said row address signal and said column address signal being applied time-division-multiplexedly.

6. The semiconductor memory device according to claim 1, further comprising output means for receiving data of said addressed memory cell for outputting to an external world, and wherein said address storage means receives a subsequent address signal for storage before data is outputted by said output means through the decoding, and selecting operation by said decoding means in accordance with the generated address signals from said address storage means.

7. The semiconductor memory device according to claim 1, wherein said address storage means includes means responsive to an active state of an address latch enable signal for incorporating the address signals for storage, and means responsive to an internal operation start instructing signal for selecting the address signal to be decoded among the stored plurality of received address signal for generation to said decoding means, and said decoding means includes means activated in response to said internal operation start instructing signal for decoding the address signal to be decoded.

8. The semiconductor memory device of claim 7, further comprising control means responsive to the active state of said address latch enable signal and to the activation of said internal operation start instructing signal for activating said decoding means.

9. The semiconductor memory device of claim 8, wherein said control means is further responsive to a clock signal applied periodically and independently of whether an address signal is applied to said semiconductor memory device, for activating said decoding means in synchronization with said clock signal when said internal operation start instructing signal is active.

10. The semiconductor memory device of claim 7, wherein said address storage means includes register means for incorporating and latching an applied address signal in synchronization with a clock signal, said clock signal applied periodically and independently of whether an address signal is applied to said semiconductor memory device.

11. The semiconductor memory device of claim 10, wherein said address storage means includes a plurality of registers provided in parallel, an incorporation means for incorporating the applied address signal when the address latch enable signal is in the active state, a first selection means responsive to a first location signal for transferring the incorporated address signal to a register designated by said first location signal, and a second selection means responsive to a second location signal for reading out a content of a register designated by the second location signal for application to said decoding means.

12. The semiconductor memory device of claim 10, further including a write register circuit for storing a plurality of write data in response to a write enable signal and for supplying a selected write data among the plurality of write data for application to a selected memory cell when the internal operation start instructing signal is active.

13. The semiconductor memory device of claim 12, wherein said write register circuit incorporates and stores the write data in correspondence to storage of the address signals in a said address storage means.

14. The semiconductor memory device of claim 10, wherein said clock signal changes between a first level and a second level, and wherein said address storage means includes row storage means for incorporating and storing a row address signal designating a row in said memory array in synchronization with a transition from the first level to the second level of said clock signal, column storage means for incorporating and storing a column address signal designating a column in said memory array in synchronization with a transition from the second level to the first level of said clock signal, and read out means for selecting and supplying a row address signal in said row storage means and a column address signal in said column storage means in parallel to said decoding means in parallel as the address signal in response to said internal operation start instructing signal.

15. The semiconductor memory device of claim 14, wherein said read out means includes means responsive to the activation of said internal operation start instructing signal for selecting and supplying the row and column address signals in parallel to said decoding means in synchronization with the transition from the second level to the first level of said-clock signal.

16. The semiconductor memory device of claim 15, further comprising control means responsive to the active state of said address latch enable signal and to the activation of said internal operation start instructing signal at the transition from the second level to the first level of said clock signal for activating said decoding means in synchronization with the transition from the second level to the first level of said clock signal.

17. The semiconductor memory device of claim 10, wherein said address signal comprises a multiple of bits, and wherein said address storage means includes storage means receiving the multiple of bits of an address signal serially for storage, and read out means for supplying the multiple of bits in parallel.

18. The semiconductor memory device of claim 17, wherein said storage means includes a multiple of register circuits each including a plurality of registers provided in parallel for storing the multiple of bits in said multiple of register circuits at registers at a common location.

19. The semiconductor memory device of claim 17, wherein said address storage means further includes a first register circuit having cascaded unit register stages having inputs corresponding to said plurality of registers for generating control signals at the inputs as said first location signal and having the contents shifted upon each incorporation of the applied address signal, and a second register circuit having cascaded unit register stages having inputs corresponding to said plurality of registers for generating control signals at inputs as said second location signal and having the contents shifted in an upper bit direction when said internal operation start instructing signal is activated.

20. The semiconductor memory device of claim 19, wherein said first register circuit and said second register circuit each constitute a ring shift register.

21. The semiconductor memory device of claim 20, wherein said address storage means further comprises;
   a detector for detecting whether the first location signal and the second location signal indicate a common register among said plurality of registers,
   first and second counter means for counting up the activation of signals generated at outputs of a final stage unit register stage in the first and second register units, respectively, identifying means whether the counts of the first and second counter means are equal to each other, and
   control means responsive to outputs of said detector and said identifying means for inhibiting an address incorporation operation when said identifying means indicates inequality and the detector detects that a common register is designated, and for inhibiting an internal memory cell selection operation when the detector detects that a common register is designated and the identifying means indicates equality.

22. The semiconductor memory device of claim 10, wherein said address storage means includes a register circuit including cascaded unit register stages to constitute a shift register, and switching means for incorporating an applied address signal for application to the register circuit when said address latch enable signal is in the active state, and control means for causing a shifting operation in said shift register after application of the address signal to said decoding means.

23. The semiconductor memory device of claim 22, wherein outputs of said cascaded unit registers and an input of a first register of the cascaded unit registers are supplied in parallel, and wherein said address storage means further includes location means for generating a location signal indicating a location to be selected among the signals supplied from the cascaded unit registers, and selection means for selecting a signal from the cascaded unit registers in accordance with the location signal when the internal operation start instructing signal is activated.

24. The semiconductor memory device claim 23, wherein said location means includes:
   a plurality of unit register stages provided corresponding to the signals from the register circuit for supplying control signals at inputs of the plurality of unit register stages in parallel, one of said control signals being activated to be said location signal, and control means for shifting the control signals through said cascaded unit registers in an upper bit direction after incorporation of the applied address signal when said internal operation start instructing signal is maintained inactive.

25. The semiconductor memory device of claim 24, wherein said control means includes a first shift means for shifting the control signals in the upper bit direction each said incorporation of the applied address signal, and a second shift means for shifting the control signals in a lower bit direction when said internal operation start instructing signal is activated.

26. The semiconductor memory device of claim 24, wherein said location means further includes a register element receiving an output of a final unit register in the cascaded unit registers to generate a signal for inhibiting an incorporation of an applied address signal.

27. The semiconductor memory device of claim 24, wherein said location means further includes an additional register stage cascaded to a first unit register of said cascaded unit registers and having an input and an output interconnected and receiving at the input a control signal of the first unit register when the internal operation start instructing signal is activated, and generating a signal for inhibiting an internal memory cell selection operation even if the internal operation start instructing signal is activated.

* * * * *